(12) United States Patent
Shoeb et al.

(10) Patent No.: US 12,119,232 B2
(45) Date of Patent: Oct. 15, 2024

(54) ETCHING ISOLATION FEATURES AND DENSE FEATURES WITHIN A SUBSTRATE

(71) Applicant: Lam Research Corporation, Fremont, CA (US)

(72) Inventors: Juline Shoeb, Fremont, CA (US); Alexander Miller Paterson, San Jose, CA (US); Ying Wu, Livermore, CA (US)

(73) Assignee: Lam Research Corporation, Fremont, CA (US)

(*) Notice: Subject to any disclaimer, the term of this patent is extended or adjusted under 35 U.S.C. 154(b) by 308 days.

(21) Appl. No.: 17/847,971

(22) Filed: Jun. 23, 2022

(65) Prior Publication Data

US 2022/0319856 A1    Oct. 6, 2022

Related U.S. Application Data

(63) Continuation of application No. 17/298,931, filed as application No. PCT/US2019/062862 on Nov. 22, 2019.

(60) Provisional application No. 62/775,735, filed on Dec. 5, 2018.

(51) Int. Cl.
| | | |
|---|---|---|
| *H01L 21/306* | (2006.01) | |
| *H01J 37/305* | (2006.01) | |
| *H01J 37/32* | (2006.01) | |
| *H01L 21/3065* | (2006.01) | |

(52) U.S. Cl.
CPC ...... *H01L 21/3065* (2013.01); *H01J 37/3053* (2013.01); *H01J 37/321* (2013.01)

(58) Field of Classification Search
CPC .. H01L 21/3065; H01J 37/3053; H01J 37/321
See application file for complete search history.

(56) References Cited

U.S. PATENT DOCUMENTS

| | | | | |
|---|---|---|---|---|
| 8,207,066 B2* | 6/2012 | Inoue | ........ | H01L 21/3065 438/719 |
| 9,852,889 B1* | 12/2017 | Kellogg | ........ | H01J 37/1471 |
| 10,026,592 B2* | 7/2018 | Chen | ........ | H01J 37/32183 |
| 10,115,568 B2* | 10/2018 | Kellogg | ........ | H01J 37/32155 |
| 10,187,032 B2* | 1/2019 | Kapoor | ........ | C23C 16/505 |
| 10,553,465 B2* | 2/2020 | Augustyniak | ........ | H01J 37/32385 |
| 11,264,207 B2* | 3/2022 | Kim | ........ | H01J 37/32009 |

(Continued)

*Primary Examiner* — Mounir S Amer
*Assistant Examiner* — Alexander Belousov
(74) *Attorney, Agent, or Firm* — PENILLA IP, APC

(57) ABSTRACT

Systems and methods for etching different features in a substantially equal manner are described. One of the methods includes applying a low frequency bias signal during a low TCP state and applying a high frequency bias signal during a high TCP state. The application of the low frequency bias signal during the low TCP state facilitates generation of hot neutrals, which are used to increase an etch rate of etching dense features compared to an etch rate for etching isolation features. The application of the high frequency bias signal during the high TCP state facilitates generation of ions to increase an etch rate of etching the isolation features compared to an etch rate of etching the dense features. After applying the low frequency bias signal during the low TCP state and the high frequency bias signal during the high TCP state, the isolation and dense features are etched similarly.

20 Claims, 8 Drawing Sheets

(56) References Cited

U.S. PATENT DOCUMENTS

| | | | | |
|---|---|---|---|---|
| 2002/0007794 A1* | 1/2002 | Byun | ................... | H01J 37/321 |
| | | | | 118/723 I |
| 2005/0241762 A1* | 11/2005 | Paterson | ........... | H01J 37/32165 |
| | | | | 156/345.28 |
| 2005/0264218 A1* | 12/2005 | Dhindsa | ............ | H01J 37/32174 |
| | | | | 315/111.21 |
| 2006/0289409 A1* | 12/2006 | Choi | ................. | H01J 37/32009 |
| | | | | 219/121.57 |
| 2008/0149592 A1* | 6/2008 | Belen | ................ | H01L 21/31116 |
| | | | | 216/41 |
| 2018/0005802 A1* | 1/2018 | Chen | ................. | H01J 37/32174 |
| 2018/0053661 A1* | 2/2018 | Park | ................... | H01J 37/32715 |
| 2019/0362942 A1* | 11/2019 | Shoeb | ................ | H01L 21/6833 |
| 2020/0251307 A1* | 8/2020 | Kim | ................ | H01J 37/32706 |
| 2021/0358757 A1* | 11/2021 | Shoeb | ................ | H01J 37/3053 |
| 2022/0319856 A1* | 10/2022 | Shoeb | ................ | H01L 21/3065 |

* cited by examiner

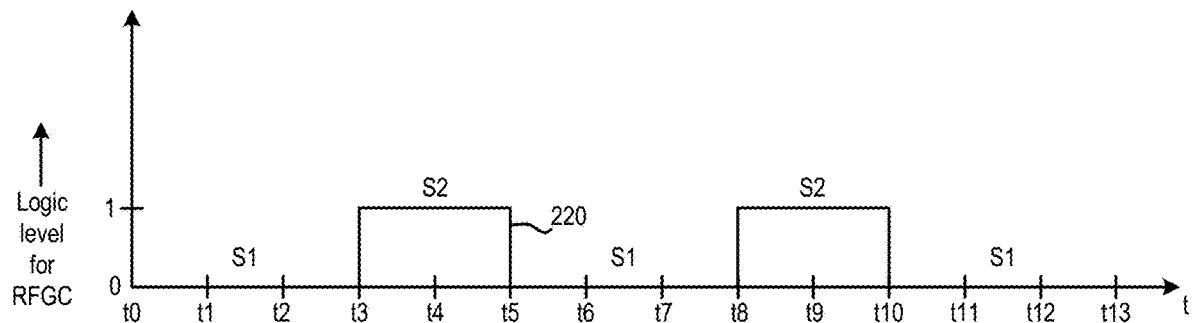
FIG. 2E
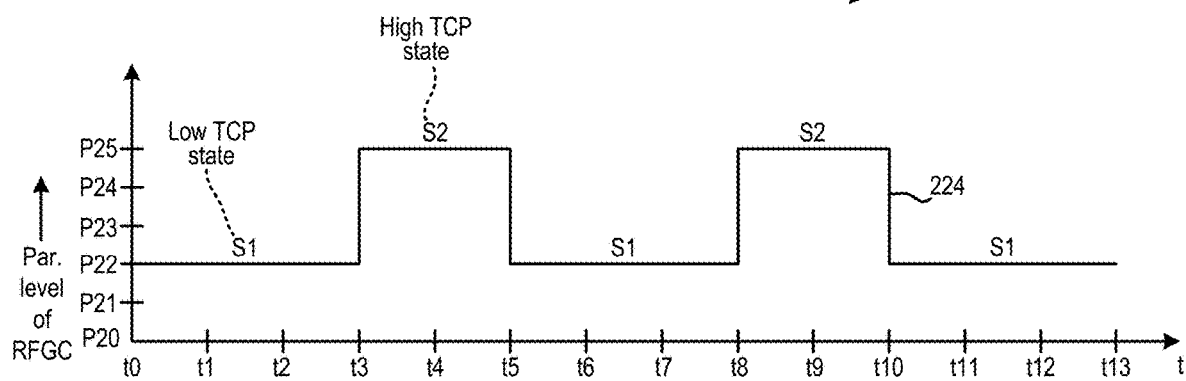
FIG. 2F
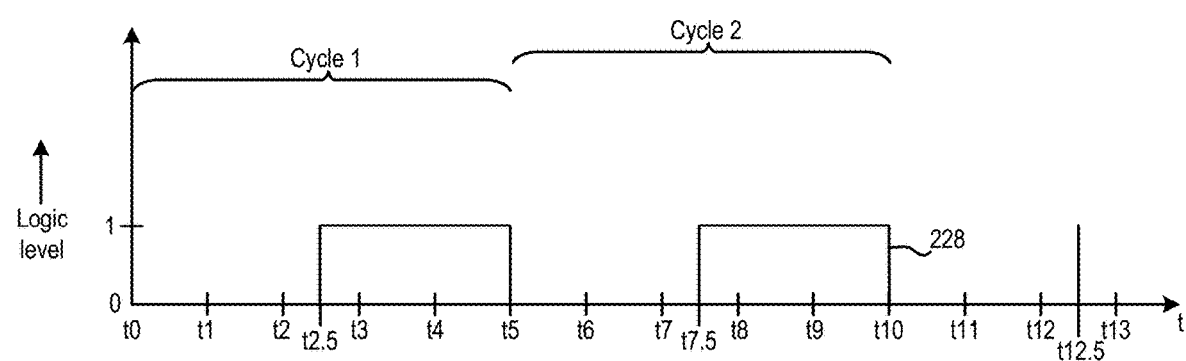
FIG. 2G (Clock)

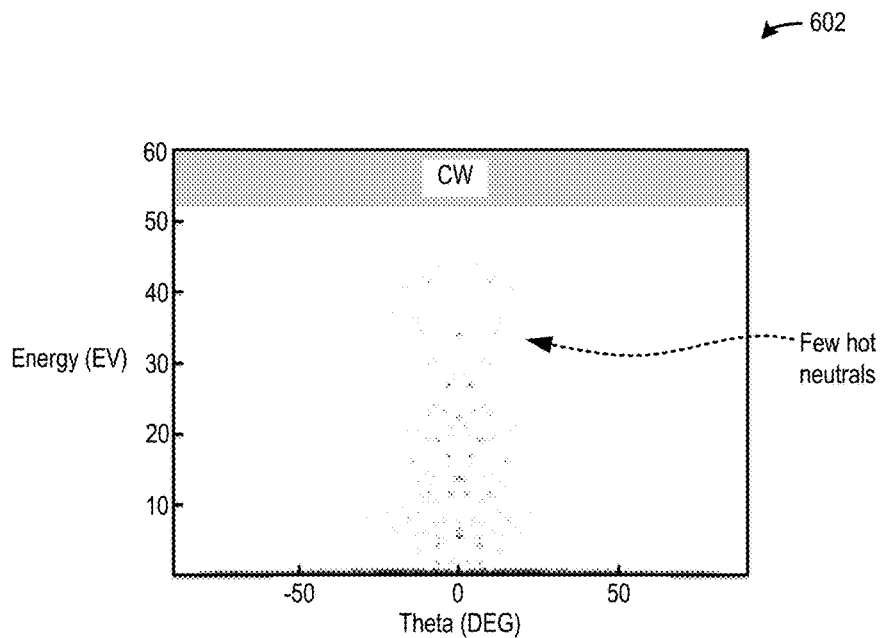
FIG. 6A
(Only a low level Vb)
CW Vb
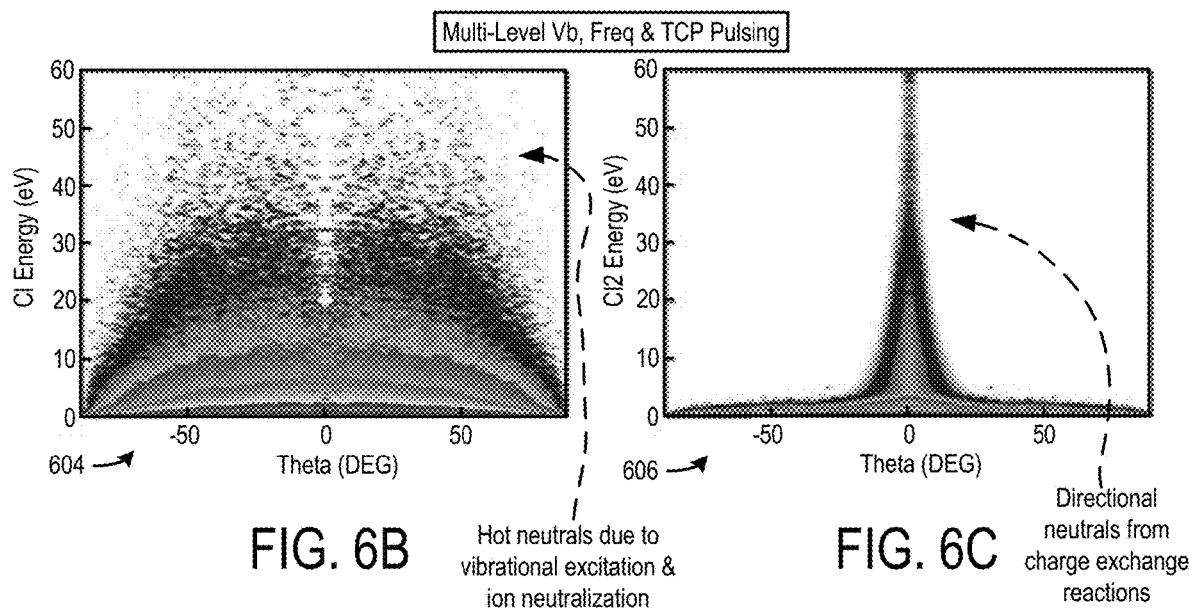
FIG. 6B
Hot neutrals due to vibrational excitation & ion neutralization
FIG. 6C
Directional neutrals from charge exchange reactions

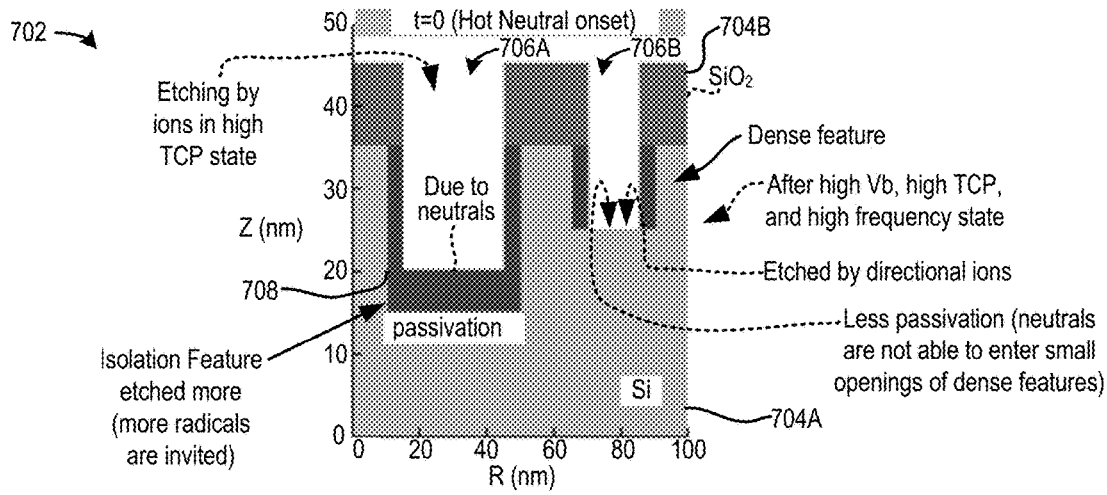
FIG. 7A
(After high TCP, high bias state)
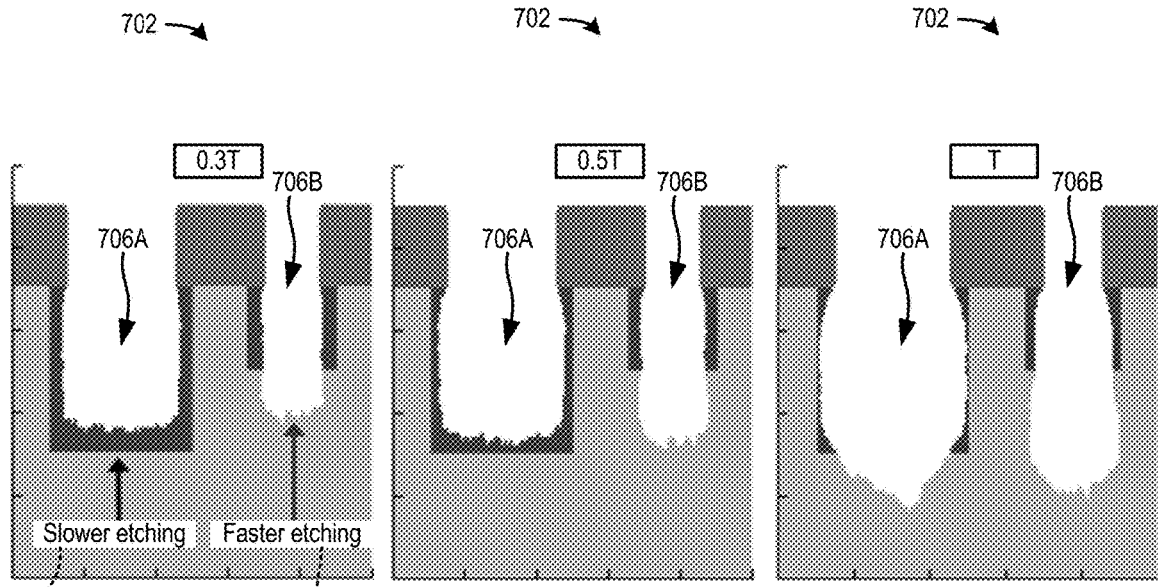
FIG. 7B
FIG. 7C
FIG. 7D

ETCHING ISOLATION FEATURES AND DENSE FEATURES WITHIN A SUBSTRATE

CLAIM OF PRIORITY

This application is a continuation of and claims priority, under 35 U.S.C. § 120, to U.S. patent application Ser. No. 17/298,931, filed on Jun. 1, 2021, and titled "ETCHING ISOLATION FEATURES AND DENSE FEATURES WITHIN A SUBSTRATE," which is a national stage filing of and claims priority, under 35 U.S.C. § 371, to PCT/US2019/062862, filed on Nov. 22, 2019, and titled "ETCHING ISOLATION FEATURES AND DENSE FEATURES WITHIN A SUBSTRATE", which claims priority, under 35 U.S.C. § 119(e), to U.S. provisional application No. 62/775,735, filed on Dec. 5, 2018, and titled "ETCHING ISOLATION FEATURES AND DENSE FEATURES WITHIN A SUBSTRATE", all of which are incorporated by reference herein in their entirety for all purposes.

FIELD

The present embodiments relate to systems and methods for etching isolation and dense features within a substrate.

BACKGROUND

The background description provided herein is for the purposes of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

In a plasma tool, a radio frequency (RF) generator supplies power. The power is supplied to a plasma chamber. In the plasma chamber, a substrate is being processed. When the power is supplied, plasma is generated within the plasma chamber to process different features of the substrate.

It is in this context that embodiments described in the present disclosure arise.

SUMMARY

Embodiments of the disclosure provide systems, apparatus, methods and computer programs for etching isolation and dense features within a substrate. It should be appreciated that the present embodiments can be implemented in numerous ways, e.g., a process, an apparatus, a system, a device, or a method on a computer readable medium. Several embodiments are described below.

In one embodiment, a method for generating hot neutrals is described. The hot neutrals are generated to achieve comparable etch rates in both the isolation and dense features of a substrate. In the method, low bias power, such as less than 10 watts is applied with a low bias frequency and a high bias power, such as greater than 100 watts is applied at a higher bias frequency. Also, in the method, the low bias frequency is applied with low transformer coupled plasma (TCP) power, such as less than 60 watts, and the higher bias frequency is applied with a high TCP power, such as greater than 100 watts. The hot neutrals are generated when the low bias power and the low TCP power are applied and the hot neutrals facilitate increasing etch rate of the dense features to compensate for higher etch rate of the isolation features during the high bias power, the higher bias frequency, and the high TCP power. The higher etch rate of the isolation features is achieved during the high bias power, the higher bias frequency, and the high TCP power due to a wider opening of the isolation features compared to the dense features. An example of the low bias frequency is a frequency that is less than 2 megahertz (MHz) and an example of the higher bias frequency is a frequency that is greater than 10 MHz. As an example, the high bias power, the higher bias frequency, and the high TCP power has a total of duty cycle less than 20% and the low bias power, the low bias frequency, and the low TCP power has a duty cycle greater than 80%. The hot neutrals will have a longer time to etch the dense features to compensate for the higher etch depth of the isolation features.

When the low bias power is applied with the low bias frequency and the low TCP power after the high bias power and the higher bias frequency and the high TCP power are applied, ion temperature drops because of the low TCP power. The drop in the ion temperature reduces ion angular spread causing ions to penetrate small openings of the dense features to enhance an etch rate of the dense features. Also, because of the low TCP power, electron temperature drops and the drop in the electron temperature produces electron attachment reactions to create a large number of negative ions. Low energy of electrons favor the electron attachment reactions over other processes because dissociation, ionization or excitation of molecules/radicals demand higher energy. Positive ions that bombard the substrate with energy have collisions with the negative ions in a pre-sheath region causing neutralization reactions and producing the hot neutrals. The low energy electrons still can have sufficient energy to produce vibrationally excited molecules and can generate the hot neutrals with successive electron impacts based on the Franck-Condon principle. Also, during charge exchange reactions, a neutral can gain charge from an ion and the ion becomes a directional hot neutral after donating the charge. A continuous wave bias voltage at any radio frequency (RF) bias frequency cannot produce sufficient hot neutrals but vibrational excitation and the neutralization reactions can produce a substantial density of isotropic hot neutrals. Also, directional hot neutrals are generated by the charge exchange reactions.

When the high bias power and the higher bias frequency and the high TCP power are applied, ions with high energy dominate a plasma process in which ions easily enter wider openings of the isolation features. The ions etch the isolation features more compared to the dense features. Wider openings or isolated features also can have an advantage of receiving more radicals through their larger openings, which helps to increase their etching. However, when the high bias power and the higher bias frequency and the high TCP power are applied, there is a higher amount of growth of a passivation layer at a bottom surface of the isolation features compared to a bottom surface of the dense features. This is because the isolation features invite more radicals to passivate its bottom surface due to the wider openings compared to the dense features, which have narrower openings. The dense features are primarily etched by directional enough ions to enter their narrower trench openings when the high bias power, the higher bias frequency and the high TCP power are applied. Such smaller openings allow a lower radical or neutral flux to passivate dense feature bottoms. Since the hot neutrals generated during a low bias power, a low TCP and a low bias frequency state are weak etching agents, they can etch silicon within the substrate slowly and a higher etching threshold passivated layer of the substrate is etched at a much slower rate. When the low bias power is applied with the low bias frequency and the low TCP power, because of less passivation at the bottom surface of the dense features, etch rate of the dense feature increases compared to that of the isolation features with a thicker passivated layer. Also, when the low bias power is applied with the low bias frequency and the low TCP power, etch rate of the isolation features drops due to the higher amount of passivation. The higher amount of passivation protects the isolation features because the hot neutrals are weak etchers and cannot clear a passivation layer at the bottom of the isolation features quickly. Since the etch rate of the dense feature is enhanced compared to the etch rage of the isolation feature during the low bias power, low TCP and low frequency state, at the end of a complete RF bias cycle, etch depths of both the isolation features and the dense features become equal or very comparable. It should be noted that the terms isolation features and isolated features are used herein interchangeably.

In an embodiment, a method for etching isolation and dense features within a substrate is described. The method includes supplying a low frequency bias RF signal to a first impedance matching circuit, supplying a high frequency bias RF signal to the first impedance matching circuit, and pulsing a TCP RF signal between a low TCP state and a high TCP state to provide the TCP RF signal to a second impedance matching circuit. The low frequency bias RF signal is supplied during the low TCP state to etch the dense features and the high frequency bias RF signal is supplied during the high TCP state to etch the isolation features.

In one embodiment, a system for etching isolation and dense features within a substrate is described. The system includes a low frequency RF generator configured to supply a low frequency bias RF signal to a first impedance matching circuit and a high frequency RF generator configured to supply a high frequency bias RF signal to the first impedance matching circuit. The system includes a TCP RF generator configured to pulse a TCP RF signal between a low TCP state and a high TCP state to provide the TCP RF signal to a second impedance matching circuit. The low frequency bias RF signal is supplied during the low TCP state to etch the dense features and the high frequency bias RF signal is supplied during the high TCP state to etch the isolation features.

In an embodiment, a controller for etching isolation and dense features within a substrate is described. The controller includes one or more processors configured to control a low frequency RF generator to supply a low frequency bias RF signal to a first impedance matching circuit. The one or more processors are further configured to control a high frequency RF generator to supply a high frequency bias RF signal to the first impedance matching circuit and control a TCP RF generator to pulse a TCP RF signal between a low TCP state and a high TCP state and to provide the TCP RF signal to a second impedance matching circuit. The one or more processors are further configured to control the low frequency RF generator to supply the low frequency bias RF signal during the low TCP state to etch the dense features. The one or more processors are configured to control the high frequency RF generator to supply the high frequency bias RF signal during the high TCP state to etch the isolation features. The controller includes a memory device coupled to the one or more processors. The memory device is configured to store a parameter level for the low TCP state and a parameter level for the high TCP state.

Some advantages of the herein described systems and methods include etching the dense and isolation features of the substrate in a substantially equal manner. During a low TCP state, the low TCP power is applied and during a high TCP state, the high TCP power is applied. With the low TCP state, the low bias frequency and the low bias power are applied. Similarly, with the high TCP state, the higher bias frequency and the high bias power are applied. The application of the low bias frequency and the low bias power in the low TCP state facilitates generation of the hot neutrals. The hot neutrals increase an etch rate of etching the dense features compared to etching the isolation features. The application of the higher bias frequency and the high bias power in the high TCP state facilitates generation of ions. The ions increase an etch rate of etching the isolation features compared to etching the dense features. As such, by applying the low bias frequency and the low bias power in the low TCP state and the higher bias frequency and the high bias power in the high TCP state, both the isolation and dense features are etched substantially equally.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2E is an embodiment of a graph to illustrate a logic level of a digital pulse signal versus the time t.

FIG. 2F is a diagram of an embodiment of a graph to illustrate an RF signal that is generated by an RF power supply PSC of yet another RF generator of FIG. 1.

FIG. 2G is an embodiment of a graph to illustrate a clock signal versus the time t.

FIG. 6A is an embodiment of an embodiment of a graph to illustrate an angular spread of hot neutrals across a surface of a substrate when a continuous bias voltage is applied to a substrate support.

FIG. 6B is a diagram of an embodiment of a graph to illustrate an angular spread of hot neutrals across the surface of the substrate when a pulsed bias voltage is applied to the substrate support.

FIG. 6C is a diagram of an embodiment of a graph to illustrate an increased directionality of hot neutrals across the surface of the substrate when the pulsed bias voltage is applied to the substrate support.

FIG. 7A is a diagram of an embodiment of a substrate to illustrate depths of isolation features and dense features after the high TCP state and the high bias state.

FIG. 7B is a diagram of an embodiment of the substrate of FIG. 7A after applying the low TCP state and the low bias state.

FIG. 7C is a diagram of an embodiment of the substrate of FIG. 7A after applying the low TCP state and the low bias state.

FIG. 7D is a diagram of an embodiment of the substrate of FIG. 7A after applying the low TCP state and the low bias state.

DETAILED DESCRIPTION

The following embodiments describe systems and methods for etching isolation and dense features within a substrate. It will be apparent that the present embodiments may be practiced without some or all of these specific details. In other instances, well known process operations have not been described in detail in order not to unnecessarily obscure the present embodiments.

Figure 1:
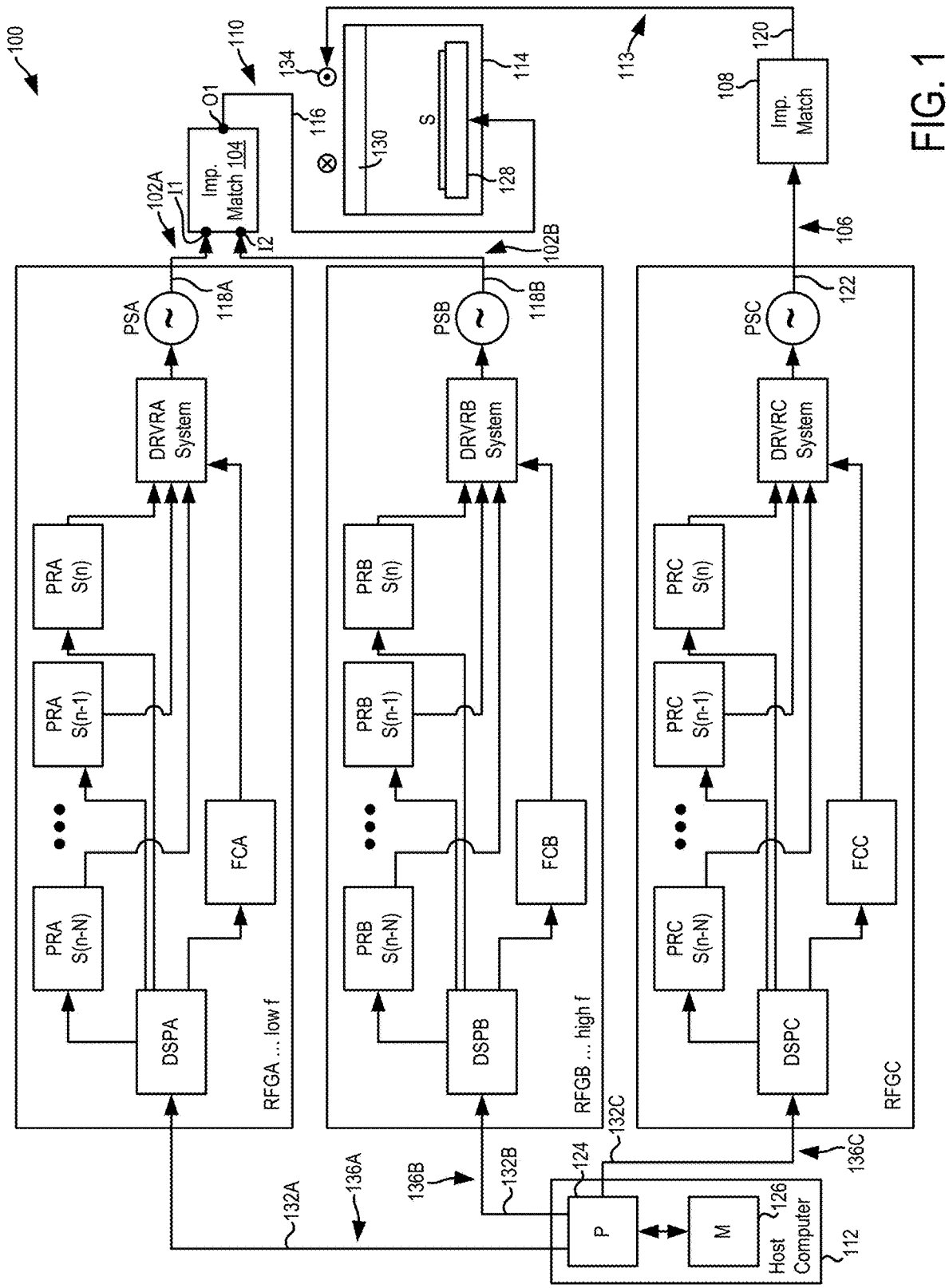
FIG. 1 is a diagram of an embodiment of a system to illustrate an application of low frequency bias pulsing during a low transformer coupled plasma (TCP) state and high frequency bias pulsing during a high TCP state.

FIG. 1 is a diagram of an embodiment of a system 100 to illustrate an application of low frequency bias pulsing with during a low transformer coupled plasma (TCP) state and high frequency bias pulsing during a high TCP state. The system 100 includes radio frequency (RF) generators RFGA, RFGB, and RFGC, an impedance match 104, another impedance match 108, a plasma chamber 114, a host computer 112. Examples of the host computer 112 include a desktop computer, laptop computer, a server, a controller, a tablet, and a smart phone. The RF generator RFGC is sometimes referred to herein as a TCP RF generator.

An impedance match, as described herein, includes a network of one or more resistors, or one or more capacitors, or one or more inductors, or a combination thereof, to match an impedance of a load coupled to an output of the impedance match with an impedance of a source coupled to an input of the impedance match. Examples of a load coupled to an output O1 of the impedance match 104 include the plasma chamber 114 and an RF transmission line 116. Moreover, examples of a source coupled to inputs I1 and I2 of the impedance match 104 include an RF cable 118A, another RF cable 118B, the RF generator RFGA, and the RF generator RFGB. Similarly, examples of a load coupled to an output of the impedance match 108 include the plasma chamber 114 and an RF transmission line 120. Moreover, examples of a source coupled to an input of the impedance match 108 include an RF cable 122 and the RF generator RFGC. It should be noted that the terms impedance match, an impedance matching circuit, and an impedance matching network are used herein interchangeably.

The host computer 112 includes a processor 124 and a memory device 126. The processor 124 is coupled to the memory device 126. As used herein, a processor is an application specific integrated circuit (ASIC), or a programmable logic device (PLD), or a central processing unit (CPU), or a microprocessor, or a microcontroller. Examples of a memory device include a random access memory (RAM) and a read-only memory (ROM). To illustrate, a memory device is a flash memory, a hard disk, or a storage device, etc. A memory device is an example of a computer-readable medium.

The plasma chamber 114 includes a substrate support 128 on which a substrate S is placed for processing. The plasma chamber 114 further includes a dielectric window 130. Examples of the substrate support 128 include a chuck and a wafer platen. The chuck can be, for example, an electrostatic chuck. The substrate support 128 includes a lower electrode, which is made from a metal, such as aluminum or an alloy of aluminum. A transformer coupled plasma (TCP) coil is situated outside the plasma chamber 114 over the dielectric window 130.

The RF generator RFGA includes a digital signal processor DSPA and multiple parameter controllers PRAS(n–N), PRAS(n–1), through PRAS(n), where n is an integer greater than zero and greater than N, and N is an integer. As an illustration, n is 3 and N is 2. Examples of a parameter, as used herein, include voltage and power. As used herein, a controller is ASIC, or a PLD, or a CPU, or a microprocessor, or a microcontroller, or a processor, or includes a processor and a memory device. The processor of the controller is coupled to the memory device of the controller. The RF generator RFGA further includes a frequency controller FCA. The RF generator RFGA further includes a driver system DRVRA and an RF power supply PSA. The power supply PSA is sometimes referred to herein as a low frequency RF power supply. An example of a driver system, as used herein, includes one or more transistors. Another example of the driver system, as used herein, includes one or more transistors that are coupled to an amplifier.

An example of the RF power supply, as used herein, include an RF oscillator that generates a sinusoidal signal at a radio frequency, such as ranging from and including 300 kilohertz (kHz) to 100 megahertz (100 MHz). For example, the RF power supply PSA generates an RF signal 102A having a low frequency that is less than or equal to 2 MHz. For example, the RF signal 102A can range from 300 kHz to 2 MHz. To illustrate, the RF power supply PSA operates at the low frequency of 400 kHz or of 2 MHz. The RF signal 102A is sometimes referred to herein as a low frequency bias RF signal.

The processor 124 is coupled to the digital signal processor DSPA via a transfer cable 132A. Examples of a transfer cable, as used herein, include a coaxial cable that is used to transfer data in a parallel manner, a cable that is used to transfer data in a serial manner, and a universal serial bus (USB) cable. The digital signal processor DSPA is coupled to the parameter controllers PRAS(n–N) through PRAS(n) and to the frequency controller FCA. Each of the parameter controllers PRAS(n–N) through PRAS(n) and the frequency controller FCA is coupled to the driver system DRVRA and the driver system DRVRA is coupled to the RF power supply PSA. The RF power supply PSA is coupled via the RF cable 118A to the input I1 of the impedance match 104. The output O1 of the impedance match 104 is coupled to the substrate support 128.

Similarly, the RF generator RFGB includes a digital signal processor DSPB and multiple parameter controllers PRBS(n–N), PRBS(n–1), through PRBS(n), where n is an integer greater than zero and greater than N, and N is an integer. The RF generator RFGB further includes a frequency controller FCB. The RF generator RFGB also includes a driver system DRVRB and the RF power supply PSB. The power supply PSB is sometimes referred to herein as a high frequency RF power supply. As an example, the RF power supply PSB generates an RF signal 102B having a high frequency that is greater than or equal to 10 MHz. For example the high frequency can range from 10 MHz to 65 MHz. To further illustrate, the RF power supply PSB operates at the high frequency of 27 kHz or of 60 MHz. The RF signal 102B is sometimes referred to herein as a high frequency bias RF signal.

The processor 124 is coupled to the digital signal processor DSPB via a transfer cable 132B. The digital signal processor DSPB is coupled to the parameter controllers PRBS(n–N) through PRBS(n) and to the frequency controller FCB. Each of the parameter controllers PRBS(n–N) through PRBS(n) and the frequency controller FCB is coupled to the driver system DRVRB and the driver system DRVRB is coupled to the RF power supply PSB. The RF power supply PSB is coupled via the RF cable 118B to the input I2 of the impedance match 104.

The RF generator RFGC includes a digital signal processor DSPC and multiple parameter controllers PRCS(n–N), PRCS(n–1), through PRCS(n), where n is an integer greater than zero and greater than N, and N is an integer. The RF generator RFGC further includes a frequency controller FCC. The RF generator RFGC includes a driver system DRVRC and an RF power supply PSC. The RF power supply PSC is sometimes referred to herein as a TCP RF power supply.

The processor 124 is coupled to the digital signal processor DSPC via a transfer cable 132C. The digital signal processor DSPC is coupled to the parameter controllers PRCS(n–N) through PRCS(n) and to the frequency controller FCC. Each of the parameter controllers PRCS(n–N) through PRCS(n) and the frequency controller FCC is coupled to the driver system DRVRC and the driver system DRVRC is coupled to the RF power supply PSC. The RF power supply PSC is coupled via the RF cable 122 to the input of the impedance match 108. The output of the impedance match 108 is coupled via the RF transmission line 120 to a TCP coil 134 that is located above the dielectric window 130.

The processor 124 generates a clock signal, which is described below with reference to FIG. 2G. Moreover, the processor 124 generates a digital pulse signal 136A and provides the digital pulse signal 136A to the digital signal processor DSPA. The digital pulse signal 136A is synchronized with reference to the clock signal in a manner described below. The digital pulse signal 136A is supplied via the transfer cable 132A to the digital signal processor DSPA.

Upon receiving the digital pulse signal 136A, the digital signal processor DSPA identifies an occurrence of a state of the digital pulse signal 136A. For example, when the digital pulse signal 136A has four states S1, S2, S3, and S4 during an occurrence of a clock cycle of the clock signal, the digital signal processor DSPA determines whether a logic level of the digital pulse signal 136A is 0, 1, 2, or 3. Upon determining that the logic level of the digital pulse signal 136A is 1, the digital signal processor DSPA identifies an occurrence of the state of the digital pulse signal 136A to be S1. Similarly, upon determining that the logic level of the digital pulse signal 136A is 2, the digital signal processor DSPA identifies an occurrence of the state of the digital pulse signal 136A to be S2. Also, upon determining that the logic level of the digital pulse signal 136A is 3, the digital signal processor DSPA identifies an occurrence of the state of the digital pulse signal 136A to be S3. Moreover, upon determining that the logic level of the digital pulse signal 136A is 0, the digital signal processor DSPA identifies an occurrence of the state of the digital pulse signal 136A to be S4.

As another example, when the digital pulse signal 136A has three states S1, S2, and S3 during an occurrence of a clock cycle of the clock signal, the digital signal processor DSPA determines whether a logic level of the digital pulse signal 136A is 0, 1, or 2. Upon determining that the logic level of the digital pulse signal 136A is 1, the digital signal processor DSPA identifies an occurrence of the state of the digital pulse signal 136A to be S1. Similarly, upon determining that the logic level of the digital pulse signal 136A is 2, the digital signal processor DSPA identifies an occurrence of the state of the digital pulse signal 136A to be S2. Also, upon determining that the logic level of the digital pulse signal 136A is 0, the digital signal processor DSPA identifies an occurrence of the state of the digital pulse signal 136A to be S3.

As yet another example, when the digital pulse signal 136A has two states S1 and S2 during an occurrence of a clock cycle of the clock signal, the digital signal processor DSPA determines whether a logic level of the digital pulse signal 136A is 0 or 1. Upon determining that the logic level of the digital pulse signal 136A is 1, the digital signal processor DSPA identifies an occurrence of the state of the digital pulse signal 136A to be S1. Similarly, upon determining that the logic level of the digital pulse signal 136A is 0, the digital signal processor DSPA identifies an occurrence of the state of the digital pulse signal 136A to be S2.

Independent of the state of the digital pulse signal 136A, the digital signal processor DSPA sends a signal to the frequency controller FCA. Upon receiving the signal from the digital signal processor DSPA, the frequency controller FCA accesses a frequency level fA stored within the frequency controller FCA and provides the frequency level fA to the driver system DRVRA. It should be noted that a frequency level is stored within a frequency controller, described herein, within a memory device of the frequency controller and the frequency level is accessed by a processor of the frequency controller from the memory device of the frequency controller. Examples of the frequency level fA stored within the frequency controller FCA include the low frequency, such as 400 kHz or 2 MHz.

Figure 2B:
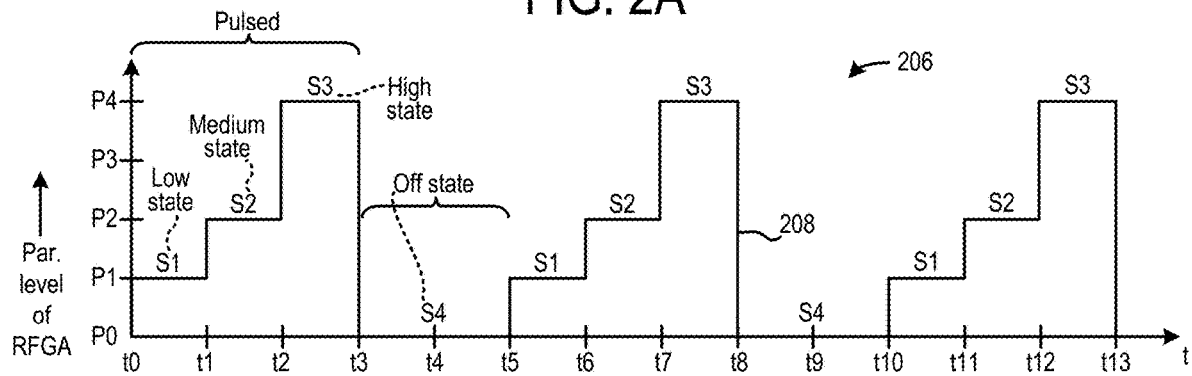
FIG. 2B is a diagram of an embodiment of a graph to illustrate a radio frequency (RF) signal that is generated by an RF power supply PSA of an RF generator of FIG. 1.

Moreover, in response to identifying the occurrence of the state of the digital pulse signal 136A to be S1, the digital signal processor DSPA sends a signal to the parameter controller PRAS(n–N). Upon receiving the signal during the occurrence of the state S1 of the digital pulse signal 136A, the parameter controller PRAS(n–N) accesses a parameter level stored within the parameter controller PRAS(n–N) and provides the parameter level to the driver system DRVRA. An example of the parameter level, for the state S1 of the digital pulse signal 136A having the four states S1 through S4 during an occurrence of a cycle of the clock signal includes a parameter level P1 (FIG. 2B). The parameter level P1 is stored within a memory device of the parameter controller PRAS(n–N). Another example of the parameter level, for the state S1 of the digital pulse signal 136A having the three states S1 through S3 during an occurrence of a cycle of the clock signal includes a parameter level P2 (FIG. 3B). The parameter level P2 is stored within the memory device of the parameter controller PRAS(n–N). Yet another example of the parameter level, for the state S1 of the digital pulse signal 136A having two states S1 and S2 during an occurrence of a cycle of the clock signal, includes the parameter level P1 (FIG. 4B).

Similarly, in response to identifying the occurrence of the state of the digital pulse signal 136A to be S2, the digital signal processor DSPA sends a signal to the parameter controller PRAS(n−2). Upon receiving the signal during the occurrence of the state S2 of the digital pulse signal 136A, the parameter controller PRAS(n−2) accesses a parameter level stored within the parameter controller PRAS(n−2) and provides the parameter level to the driver system DRVRA. An example of the parameter level, for the state S2 of the digital pulse signal 136A having the four states S1 through S4 during an occurrence of a cycle of the clock signal includes the parameter level P2 (FIG. 2B). The parameter level P2 is stored within a memory device of the parameter controller PRAS(n−2). Another example of the parameter level, for the state S2 of the digital pulse signal 136A having the three states S1 through S3 during an occurrence of a cycle of the clock signal includes a parameter level P4 (FIG. 3B). An example of the parameter level P4 is a power level less than 10 watts (W). The parameter level P4 is stored within the memory device of the parameter controller PRAS (n−2). Yet another example of the parameter level, for the state S2 of the digital pulse signal 136A, having two states S1 and S2 during an occurrence of a cycle of the clock signal, includes a parameter level P0 (FIG. 4B). An example of the parameter level P0 is zero power or zero voltage or substantially zero power or substantially zero voltage. The parameter level P0 is stored within the memory device of the parameter controller PRAS(n−2).

Moreover, in response to identifying the occurrence of the state of the digital pulse signal 136A to be S3, the digital signal processor DSPA sends a signal to the parameter controller PRAS(n−1). Upon receiving the signal during the occurrence of the state S3 of the digital pulse signal 136A, the parameter controller PRAS(n−1) accesses a parameter level stored within the parameter controller PRAS(n−1) and provides the parameter level to the driver system DRVRA. An example of the parameter level, for the state S3 of the digital pulse signal 136A having the four states S1 through S4 during an occurrence of a cycle of the clock signal includes the parameter level P4 (FIG. 2B). The parameter level P4 is stored within a memory device of the parameter controller PRAS(n−1). Another example of the parameter level, for the state S3 of the digital pulse signal 136A having the three states S1 through S3 during an occurrence of a cycle of the clock signal, includes a parameter level P0 (FIG. 3B). The parameter level P0 is stored within the memory device of the parameter controller PRAS(n−1).

Also, in response to identifying the occurrence of the state of the digital pulse signal 136A to be S4, the digital signal processor DSPA sends a signal to the parameter controller PRAS(n). Upon receiving the signal during the occurrence of the state S4 of the digital pulse signal 136A, the parameter controller PRAS(n) accesses a parameter level stored within the parameter controller PRAS(n) and provides the parameter level to the driver system DRVRA. An example of the parameter level, for the state S4 of the digital pulse signal 136A having the four states S1 through S4 during an occurrence of a cycle of the clock signal, includes the parameter level P0 (FIG. 2B). The parameter level P4 is stored within a memory device of the parameter controller PRAS(n).

During the occurrence of the state S1 of the digital pulse signal 136A, the driver system DRVRA generates a current signal based on the frequency level fA received from the frequency controller FCA and the parameter level P1 (FIG. 2B), P2 (FIG. 3B), or P1 (FIG. 4B), and provides the current signal to the RF power supply PSA. Also, the RF power supply PSA generates the RF signal 102A upon receiving the current signal from the driver system DRVRA during the occurrence of the state S1 of the digital pulse signal 136A. The RF signal 102A has the frequency level fA and the parameter level P1 (FIG. 2B), P2 (FIG. 3B), or P1 (FIG. 4B) during the occurrence of the state S1 of the digital pulse signal 136A.

Similarly, during the occurrence of the state S2 of the digital pulse signal 136A, the driver system DRVRA generates a current signal based on the frequency level fA received from the frequency controller FCA and the parameter level P2 (FIG. 2B), P4 (FIG. 3B), or P0 (FIG. 4B), and provides the current signal to the RF power supply PSA. Also, the RF power supply PSA generates the RF signal 102A upon receiving the current signal from the driver system DRVRA during the occurrence of the state S2 of the digital pulse signal 136A. The RF signal 102A has the frequency level fA and the parameter level P2 (FIG. 2B), P4 (FIG. 3B), or P0 (FIG. 4B) during the occurrence of the state S2 of the digital pulse signal 136A.

Also, during the occurrence of the state S3 of the digital pulse signal 136A, the driver system DRVRA generates a current signal based on the frequency level fA received from the frequency controller FCA and the parameter level P4 (FIG. 2B) or P0 (FIG. 3B), and provides the current signal to the RF power supply PSA. Also, the RF power supply PSA generates the RF signal 102A upon receiving the current signal from the driver system DRVRA during the occurrence of the state S3 of the digital pulse signal 136A. The RF signal 102A has the frequency level fA and the parameter level P4 (FIG. 2B) or P0 (FIG. 3B) during the occurrence of the state S3 of the digital pulse signal 136A.

Furthermore, during the occurrence of the state S4 of the digital pulse signal 136A, the driver system DRVRA generates a current signal based on the frequency level fA received from the frequency controller FCA and the parameter level P0 (FIG. 2B), and provides the current signal to the RF power supply PSA. Also, the RF power supply PSA generates the RF signal 102A upon receiving the current signal from the driver system DRVRA during the occurrence of the state S4 of the digital pulse signal 136A. The RF signal 102A has the frequency level fA and the parameter level P0 (FIG. 2B) during the occurrence of the state S4 of the digital pulse signal 136A.

The processor 124 generates a digital pulse signal 136B and provides the digital pulse signal 136B to the digital signal processor DSPA. The digital pulse signal 136B is synchronized with reference to the clock signal in a manner described below. The digital pulse signal 136B is supplied via the transfer cable 132B to the digital signal processor DSPB.

Upon receiving the digital pulse signal 136B, the digital signal processor DSPB identifies an occurrence of a state of the digital pulse signal 136B. For example, when the digital pulse signal 136B has three states S1, S2, and S3 during an occurrence of a clock cycle of the clock signal, the digital signal processor DSPB determines whether a logic level of the digital pulse signal 136B is 0, 1, or 2. Upon determining that the logic level of the digital pulse signal 136B is 0, the digital pulse signal DSPB identifies the occurrence of the state of the digital pulse signal 136B to be S1. Similarly, upon determining that the logic level of the digital pulse signal 136B is 1, the digital pulse signal DSPB identifies the occurrence of the state of the digital pulse signal 136B to be S2. Also, upon determining that the logic level of the digital pulse signal 136B is 2, the digital signal processor DSPB identifies the occurrence of the state of the digital pulse signal 136B to be S3.

As another example, when the digital pulse signal 136B has two states S1 and S2 during an occurrence of a clock cycle of the clock signal, the digital signal processor DSPB determines whether a logic level of the digital pulse signal 136B is 0 or 1. Upon determining that the logic level of the digital pulse signal 136B is 0, the digital pulse signal DSPB identifies the occurrence of the state of the digital pulse signal 136B to be S1. Similarly, upon determining that the logic level of the digital pulse signal 136B is 1, the digital pulse signal DSPB identifies the occurrence of the state of the digital pulse signal 136B to be S2.

Independent of the state of the digital pulse signal 136B, the digital signal processor DSPB sends a signal to the frequency controller FCB. Upon receiving the signal from the digital signal processor DSPB, the frequency controller FCB accesses a frequency level fB stored within the frequency controller FCB and provides the frequency level fB to the driver system DRVRB. Examples of the frequency level fB stored within the frequency controller FCB include the high frequency, such as 27 MHz or 60 MHz.

Figure 2D:
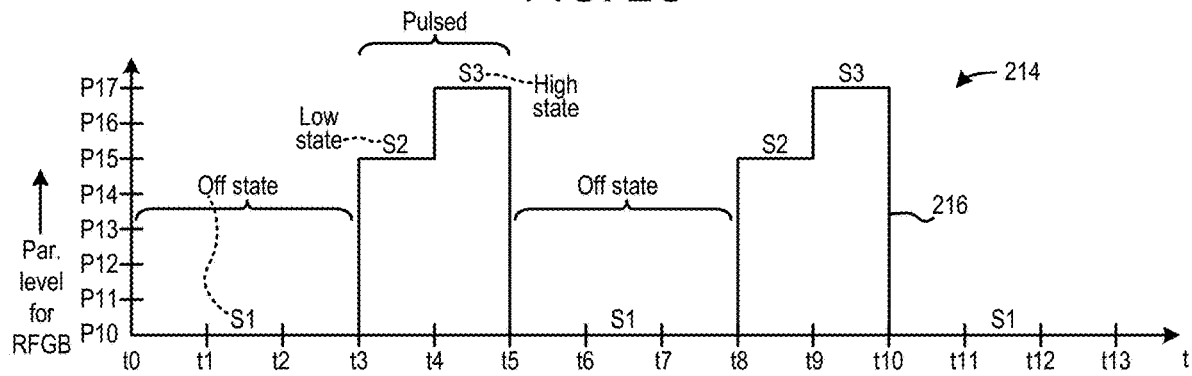
FIG. 2D is a diagram of an embodiment of a graph to illustrate an RF signal that is generated by an RF power supply PSB of another RF generator of FIG. 1.

Moreover, in response to identifying the occurrence of the state of the digital pulse signal 136B to be S1, the digital signal processor DSPB sends a signal to the parameter controller PRBS(n–N). Upon receiving the signal during the occurrence of the state S1 of the digital pulse signal 136B, the parameter controller PRBS(n–N) accesses a parameter level stored within the parameter controller PRBS(n–N) and provides the parameter level to the driver system DRVRB. An example of the parameter level, for the state S1 of the digital pulse signal 136B having the three states S1 through S3 during an occurrence of a cycle of the clock signal, includes a parameter level P10 (FIG. 2D). An example of the parameter level P10 is zero power or a zero voltage or substantially zero power or substantially zero voltage. The parameter level P10 is stored within a memory device of the parameter controller PRBS(n–N). Another example of the parameter level, for the state S1 of the digital pulse signal 136B having the two states S1 and S2 during an occurrence of a cycle of the clock signal includes the parameter level P10 (FIG. 3D or FIG. 4D).

Similarly, in response to identifying the occurrence of the state of the digital pulse signal 136B to be S2, the digital signal processor DSPB sends a signal to the parameter controller PRBS(n–2). Upon receiving the signal during the occurrence of the state S2 of the digital pulse signal 136B, the parameter controller PRBS(n–2) accesses a parameter level stored within the parameter controller PRBS(n–2) and provides the parameter level to the driver system DRVRB. An example of the parameter level, for the state S2 of the digital pulse signal 136B having the three states S1 through S3 during an occurrence of a cycle of the clock signal includes a parameter level P15 (FIG. 2D). An example of the parameter level P15 is a power level that is greater than or equal to 100 watts. The parameter level P15 is stored within a memory device of the parameter controller PRBS(n–2). Another example of the parameter level, for the state S2 of the digital pulse signal 136A having the two states S1 and S2 during an occurrence of a cycle of the clock signal includes the parameter level P15 (FIG. 3D or 4D).

Moreover, in response to identifying the occurrence of the state of the digital pulse signal 136B to be S3, the digital signal processor DSPB sends a signal to the parameter controller PRBS(n–1). Upon receiving the signal during the occurrence of the state S3 of the digital pulse signal 136B, the parameter controller PRBS(n–1) accesses a parameter level stored within the parameter controller PRBS(n–1) and provides the parameter level to the driver system DRVRB. An example of the parameter level, for the state S3 of the digital pulse signal 136B having the three states S1 through S3 during an occurrence of a cycle of the clock signal includes a parameter level P17 (FIG. 2D). The parameter level P17 is stored within a memory device of the parameter controller PRBS(n–1).

During the occurrence of the state S1 of the digital pulse signal 136B, the driver system DRVRB generates a current signal based on the frequency level fB received from the frequency controller FCB and the parameter level P10 (FIG. 2D or 3D or 4D), and provides the current signal to the RF power supply PSB. Also, the RF power supply PSB generates the RF signal 102B upon receiving the current signal from the driver system DRVRB during the occurrence of the state S1 of the digital pulse signal 136B. The RF signal 102B has the frequency level fB and the parameter level P10 (FIG. 2D or 3D or 4D) during the occurrence of the state S1 of the digital pulse signal 136B.

Similarly, during the occurrence of the state S2 of the digital pulse signal 136B, the driver system DRVRB generates a current signal based on the frequency level fB received from the frequency controller FCB and the parameter level P15 (FIG. 2D or 3D or 4D), and provides the current signal to the RF power supply PSB. Also, the RF power supply PSB generates the RF signal 102B upon receiving the current signal from the driver system DRVRB during the occurrence of the state S2 of the digital pulse signal 136B. The RF signal 102B has the frequency level fB and the parameter level P15 (FIG. 2D or 3D or 4D) during the occurrence of the state S2 of the digital pulse signal 136B.

Also, during the occurrence of the state S3 of the digital pulse signal 136B, the driver system DRVRB generates a current signal based on the frequency level fB received from the frequency controller FCB and the parameter level P17 (FIG. 2D), and provides the current signal to the RF power supply PSB. Also, the RF power supply PSB generates the RF signal 102B upon receiving the current signal from the driver system DRVRB during the occurrence of the state S3 of the digital pulse signal 136B. The RF signal 102B has the frequency level fB and the parameter level P17 (FIG. 2D) during the occurrence of the state S3 of the digital pulse signal 136B.

The processor 124 generates a digital pulse signal 136C and provides the digital pulse signal 136C to the digital signal processor DSPC. The digital pulse signal 136C is synchronized with reference to the clock signal in a manner described below. The digital pulse signal 136C is supplied via the transfer cable 132C to the digital signal processor DSPC.

Upon receiving the digital pulse signal 136C, the digital signal processor DSPC identifies an occurrence of a state of the digital pulse signal 136C. For example, when the digital pulse signal 136C has two states S1 and S2 during an occurrence of a clock cycle of the clock signal, the digital signal processor DSPC determines whether the logic level of the digital pulse signal 136C is 0 or 1. Upon determining that the logic level of the digital pulse signal 136C is 0, the digital pulse signal DSPC identifies the occurrence of the state of the digital pulse signal 136C to be S1. Similarly, upon determining that the logic level of the digital pulse signal 136C is 1, the digital pulse signal DSPC identifies the occurrence of the state of the digital pulse signal 136C to be S2.

Independent of the state of the digital pulse signal 136C, the digital signal processor DSPC sends a signal to the frequency controller FCC. Upon receiving the signal from the digital signal processor DSPC, the frequency controller FCC accesses a frequency level fC stored within the frequency controller FCC and provides the frequency level fC to the driver system DRVRC.

Moreover, in response to identifying the occurrence of the state of the digital pulse signal 136C to be S1, the digital signal processor DSPC sends a signal to the parameter controller PRCS(n–N). Upon receiving the signal during the occurrence of the state S1 of the digital pulse signal 136C, the parameter controller PRCS(n–N) accesses a parameter level stored within the parameter controller PRCS(n–N) and provides the parameter level to the driver system DRVRC. An example of the parameter level, for the state S1 of the digital pulse signal 136C having the two states S1 and S2 during an occurrence of a cycle of the clock signal, includes a parameter level P22 (FIG. 2F). The parameter level P22 is stored within a memory device of the parameter controller PRCS(n–N). An example of the parameter level P22 is a power level less than or equal to 60 watts.

Similarly, in response to identifying the occurrence of the state of the digital pulse signal 136C to be S2, the digital signal processor DSPC sends a signal to the parameter controller PRCS(n–2). Upon receiving the signal during the occurrence of the state S2 of the digital pulse signal 136C, the parameter controller PRCS(n–2) accesses a parameter level stored within the parameter controller PRCS(n–2) and provides the parameter level to the driver system DRVRC. An example of the parameter level, for the state S2 of the digital pulse signal 136C having the two states S1 and S2 during an occurrence of a cycle of the clock signal includes a parameter level P25 (FIG. 2F). The parameter level P25 is stored within a memory device of the parameter controller PRCS(n–2). An example of the parameter level P25 is a power level greater than or equal to 100 watts.

During the occurrence of the state S1 of the digital pulse signal 136C, the driver system DRVRC generates a current signal based on the frequency level fC received from the frequency controller FCC and the parameter level P22 (FIG. 2F), and provides the current signal to the RF power supply PSC. Also, the RF power supply PSC generates an RF signal 106 upon receiving the current signal from the driver system DRVRC during the occurrence of the state S1 of the digital pulse signal 136C. The RF signal 106 is sometimes referred to herein as a TCP RF signal. The RF signal 106 has the frequency level fC and the parameter level P22 (FIG. 2F) during the occurrence of the state S1 of the digital pulse signal 136C.

Similarly, during the occurrence of the state S2 of the digital pulse signal 136C, the driver system DRVRC generates a current signal based on the frequency level fC received from the frequency controller FCC and the parameter level P25 (FIG. 2F), and provides the current signal to the RF power supply PSC. Also, the RF power supply PSC generates the RF signal 106 upon receiving the current signal from the driver system DRVRC during the occurrence of the state S2 of the digital pulse signal 136C. The RF signal 106 has the frequency level fC and the parameter level P25 (FIG. 2F) during the occurrence of the state S2 of the digital pulse signal 136C.

The impedance match 104 receives the RF signal 102A from the RF power supply PSA via the RF cable 118A and receives the RF signal 102B from the RF power supply PSB via the RF cable 118B, and matches an impedance of the load coupled to the output O1 with an impedance of the source coupled to the inputs I1 and I2 to generate a modified RF signal 110 at the output O2. The modified RF signal 110 output from the impedance match 104 is supplied via the RF transmission line 116 to the substrate support 128.

Similarly, the impedance match 108 receives the RF signal 106 via the RF cable 122 and matches an impedance of the load coupled to the output of the impedance match 108 with an impedance of the source coupled to the input of the impedance match 108 to generate a modified RF signal 113. The modified RF signal 113 is supplied from the output of the impedance match 108 to the TCP coil 134.

When one or more process gases are supplied to the plasma chamber 114 in addition to supplying the modified RF signal 110 and the modified RF signal 113, plasma is stricken or maintained within the plasma chamber 114 to process the substrate S. Examples of the one or more process gases include an oxygen-containing gas, such as $O_2$. Other examples of the one or more process gases include a chlorine-containing gas and a fluorine-containing gas, e.g., tetrafluoromethane ($CF_4$), sulfur hexafluoride ($SF_6$), hexafluoroethane ($C_2F_6$), etc. Examples of processing the substrate S includes depositing a material on the substrate S, etching the substrate S, cleaning the substrate S, and sputtering the substrate S.

In one embodiment, the any number of TCP coils, such as two, three, or four, are disposed above the dielectric window 130. In an embodiment, one or more TCP coils are located next to a sidewall of the plasma chamber 114.

In an embodiment, instead of the plasma chamber 114 being a TCP plasma chamber, a capacitively coupled plasma (CCP) chamber is used. The CCP chamber includes an upper electrode, such as a capacitive plate, and the chuck. The chuck faces the upper electrode. The upper electrode is coupled to the RF transmission line 120. The upper electrode is made of a metal, such as aluminum or an alloy of aluminum.

In an embodiment, the parameter controllers PRAS(n–N) through PRAS(n), the frequency controller FCA, and the digital signal processor DSPA are parts of a controller of the RF generator RFGA. For example, functions, described herein, as performed by the parameter controllers PRAS(n–N) through PRAS(n), the frequency controller FCA, and the digital signal processor DSPA are performed by the controller of the RF generator RFGA. Similarly, in one embodiment, the parameter controllers PRBS(n–N) through PRBS(n), the frequency controller FCB, and the digital signal processor DSPB are parts of a controller of the RF generator RFGB. Also, in a similar manner, in one embodiment, the parameter controllers PRCS(n–N) through PRCS(n), the frequency controller FCC, and the digital signal processor DSPC are parts of a controller of the RF generator RFGC.

In an embodiment, the TCP coil 134 is considered to be a part of the plasma chamber 114.

In one embodiment, a combination of the digital signal processor DSPA, the parameter controllers PRAS(n–N) through PRAS(n), and the frequency controller FCA is sometimes referred to herein as a controller. For example, each of the digital signal processor DSPA, the parameter controller PRAS(n–N), the parameter controller PRAS(n–1), the parameter controller PRAS(n), the frequency controller FCA is a portion, such as a hardware circuit or a software module, of the controller. Similarly, in an embodiment, a combination of the digital signal processor DSPB, the parameter controllers PRBS(n–N) through PRBS(n), and the frequency controller FCB is sometimes referred to herein as a controller. Also, in one embodiment, a combination of the digital signal processor DSPC, the parameter controllers PRCS(n–N) through PRCS(n), and the frequency controller FCC is sometimes referred to herein as a controller.

In an embodiment, any parameter levels, described herein, of the RF signal 102A are provided from the processor 124 via the transfer cable 132A or another transfer cable to the digital signal processor DSPA. In some embodiments, the frequency level fA of the RF signal 102A is provided from the processor 124 via the transfer cable 132A or another transfer cable to the digital signal processor DSPA. Upon receiving the frequency level fA, the digital signal processor DSPA sends the frequency level to the frequency controller FCA. The parameter levels and the frequency level fA of the RF signal 102A are stored in the memory device 126.

In one embodiment, any parameter levels, described herein, of the RF signal 102B are provided from the processor 124 via the transfer cable 132B or another transfer cable to the digital signal processor DSPB. In some embodiments, the frequency level fA of the RF signal 102B is provided from the processor 124 via the transfer cable 132B or another transfer cable to the digital signal processor DSPB. Upon receiving the frequency level fB, the digital signal processor DSPB sends the frequency level to the frequency controller FCB. The parameter levels and the frequency level fB of the RF signal 102B are stored in the memory device 126.

In an embodiment, any parameter levels, described herein, of the RF signal 106 are provided from the processor 124 via the transfer cable 132C or another transfer cable to the digital signal processor DSPC. In some embodiments, the frequency level fC of the RF signal 106 is provided from the processor 124 via the transfer cable 132C or another transfer cable to the digital signal processor DSPC. Upon receiving the frequency level fC, the digital signal processor DSPC sends the frequency level to the frequency controller FCC. The parameter levels and the frequency level fC of the RF signal 106 are stored in the memory device 126.

Figure 2A:
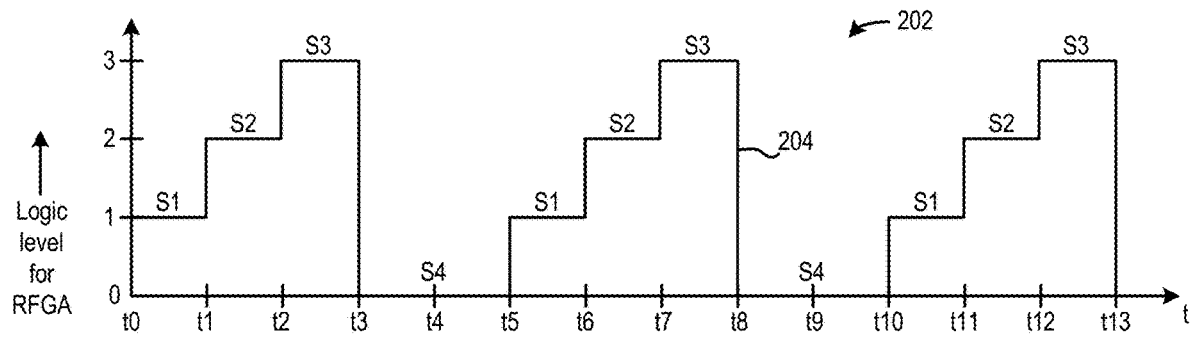
FIG. 2A is an embodiment of a graph to illustrate a logic level of a digital pulse signal versus time t.

FIG. 2A is an embodiment of a graph 202 to illustrate a logic level of a digital pulse signal 204 versus time t. The digital pulse signal 204 is an example of the digital pulse signal 136A (FIG. 1) that is provided by the processor 124 (FIG. 1) to the RF generator RFGA (FIG. 1). During a time period between a time t0 and a time t1, the digital pulse signal 204 has an occurrence of the state S1. The state S1 of the digital pulse signal 204 has the logic level 1. Moreover, during a time period between the time t1 and a time t2, the digital pulse signal 204 has an occurrence of a state S2, which has the logic level 2. Also, during a time period between the time t2 and a time t3, the digital pulse signal 204 has an occurrence of a state S3, which has the logic level 3. During a time period between the time t3 and a time t5, the digital pulse signal 204 has an occurrence of a state S4, which has the logic level 0. The occurrences of the states S1 through S4 of the digital pulse signal 204 repeat after the time t5 for a time period between the time t5 and a time t10, and repeat again for a time period after the time t10.

It should be noted that the logic level 1 is greater than the logic level 0, the logic level 2 is greater than the logic level 1, and the logic level 3 is greater than the logic level 2. It should further be noted that any two time periods of the time t are equal. For example, the time period between the times t1 and t2 is equal to the time period between the times t2 and t3 and to the time period between the times t1 and t0.

In one embodiment, the digital pulse signal 204 has a duty cycle that is greater than or equal to 80%. For example, the digital pulse signal 204 has a duty cycle that is 80% or substantially 80%, such as a duty cycle within 5-10% from the 80% duty cycle. To illustrate, a time period between the times t0 and t3 during which the digital pulse signal 204 has the logic level of greater than zero is greater than or equal to 80% of a time period between the times t0 and t5. As another illustration, the digital pulse signal 204 has a duty cycle that can range from 70% to 90%.

FIG. 2B is a diagram of an embodiment of a graph 206 to illustrate an RF signal 208 that is generated by the RF power supply PSA of the RF generator RFGA (FIG. 1). The RF signal 208 has the same duty cycle as that of the digital pulse signal 204 (FIG. 2A). The graph 206 plots a parameter level, such as an amplitude, of the RF signal 208 versus the time t. The RF signal 208 is an example of the RF signal 102A (FIG. 1) that is generated by the RF generator RFGA. Examples of an amplitude, as used herein, include a peak-to-peak amplitude, a maximum amplitude, and a zero-to-peak amplitude. The RF signal 208 has an occurrence of the state S1 during the time period between the times t0 and t1. The state S1 of the RF signal 208 has the parameter level P1. Moreover, the RF signal 208 has an occurrence of the state S2 during the time period between the times t1 and t2. The state S2 of the RF signal 208 has the parameter level P2. Also, the RF signal 208 has an occurrence of the state S3 during the time period between the times t2 and t3. The state S3 of the RF signal 208 has the parameter level P4. The RF signal 208 has an occurrence of the state S4 during the time period between the times t3 and t5. The state S4 of the RF signal 208 has the parameter level P0. Examples of the parameter level P0 include a voltage level of zero and a power level of zero. Additional examples of the parameter level P0 include a voltage level that is substantially zero and a power level that is substantially zero. An example of a voltage level that is substantially zero is a voltage level that is within 5-10% from a voltage level of zero and an example of a power level that is substantially zero is a power level that is within 5-10% from a power level of zero. The RF signal 208 has additional occurrences of the states S1 through S4. Occurrences of the states S1 through S4 of the RF signal 208 repeat during the time period between the times t5 and t10 and again repeat after the time t10.

The state S1 of the RF signal 208 is sometimes referred to herein as a low state, the state S2 of the RF signal 208 is sometimes referred to herein as a medium state, and the state S3 of the RF signal 208 is sometimes referred to herein as a high state. The state S4 of the RF signal 208 is sometimes referred to herein as an off state.

It should be noted that the parameter level P1 is greater than the parameter level P0. The parameter level P2 is greater than the parameter level P1 and a parameter level P3 is greater than the parameter level P2. The parameter level P4 is greater than the parameter level P3.

The RF signal 208 pulses from the state S1 to the state S2 and from the state S2 to the state S3. For example, the RF signal 208 transitions from the state S1 to the state S2 at the time t1 or substantially at the time t1 and transitions from the state S2 to the state S3 at the time t2 or substantially at the time t2. The RF signal 208 further pulses from the state S3 to the state S4. As an example, the RF signal 208 transitions from the state S3 to the state S4 at the time t3 or substantially at the time t3. The RF signal 208 transitions from the state S4 to another occurrence of the state S1 at the time t5 or substantially at the time t5. As an example, a transition that occurs substantially at a time is a transition that occurs within 5-10% of the clock cycle from the time. To illustrate, the transition from the state S2 to the state S3 occurs substantially within 5-10% of a time period of the clock cycle from the time t2.

In one embodiment, the state S3 of the RF signal 208 has the parameter level P3.

In one embodiment, the memory device 126 stores the parameter levels, described herein, for the RF generator RFGA. The processor 124 provides the parameter levels to the RF generator RFGA. For example, the processor 124 sends the parameter levels of the RF signal 208 and an instruction via the transfer cable 132A to the digital signal processor DSPA. The parameter levels of the RF signal 208 are stored in the memory device 126. The DSPA determines from the instruction to distribute the parameter levels of the RF signal 208 to the parameter controllers PRAS(n–N), PRAS(n–2), PRAS(n–1), and PRAS(n). For example, the parameter level P1 is sent from the digital signal processor DSPA to the parameter controller PRAS(n–N), the parameter level P2 is sent from the digital signal processor DSPA to the parameter controller PRAS(n–2), the parameter level P4 is sent from the digital signal processor DSPA to the parameter controller PRAS(n–1), and the parameter level P0 is sent from the digital signal processor DSPA to the parameter controller PRAS(n–N). The parameter level P1 is stored in the memory device of the parameter controller PRAS(n–N), the parameter level P2 is stored in the memory device of the parameter controller PRAS(n–2), the parameter level P4 is stored in the memory device of the parameter controller PRAS(n–1), and the parameter level P0 is stored in the memory device of the parameter controller PRAS(n).

Figure 2C:
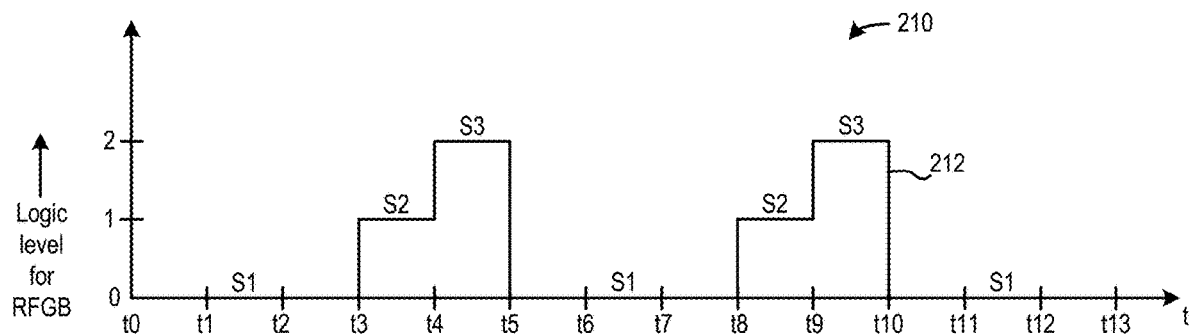
FIG. 2C is an embodiment of a graph to illustrate a logic level of a digital pulse signal versus the time t.

FIG. 2C is an embodiment of a graph 210 to illustrate a logic level of a digital pulse signal 212 versus the time t. The digital pulse signal 212 is an example of the digital pulse signal 136B (FIG. 1) that is provided by the processor 124 (FIG. 1) to the RF generator RFGB (FIG. 1). During the time period between the times t0 and t3, the digital pulse signal 212 has an occurrence of the state S1. The state S1 of the digital pulse signal 212 has the logic level 0. Moreover, during a time period between the time t3 and a time t4, the digital pulse signal 212 has an occurrence of a state S2, which has the logic level 1. Also, during a time period between the time t4 and the time t5, the digital pulse signal 212 has an occurrence of a state S3, which has a logic level 2. The occurrences of the states S1 through S3 of the digital pulse signal 212 repeat after the time t5 for the time period between the time t5 and a time t10, and repeat again for the time period after the time t10.

In one embodiment, the digital pulse signal 212 has a duty cycle that is less than or equal to 20%. For example, the digital pulse signal 212 has a duty cycle that is 20% or substantially 20%, such as a duty cycle within 5-10% from the 20% duty cycle. To illustrate, a time period between the times t3 and t5 during which the digital pulse signal 212 has the logic level of greater than zero is less than or equal to 20% of a time period between the times t0 and t5. As another illustration, the digital pulse signal 212 has a duty cycle that can range from 10% to 30%.

FIG. 2D is a diagram of an embodiment of a graph 214 to illustrate an RF signal 216 that is generated by the RF power supply PSB of the RF generator RFGB (FIG. 1). A duty cycle of the RF signal 216 is the same as the duty cycle of the digital pulse signal 212. The graph 214 plots a parameter level, such as an amplitude, of the RF signal 216 versus the time t. The RF signal 216 is an example of the RF signal 102B (FIG. 1) that is generated by the RF generator RFGB. The RF signal 216 has an occurrence of the state S1 during the time period between the times t0 and t3. The state S1 of the RF signal 216 has a parameter level P10. Examples of the parameter level P10 include a voltage level of zero and a power level of zero. Additional examples of the parameter level P10 include a voltage level that is substantially zero and a power level that is substantially zero. Moreover, the RF signal 216 has an occurrence of the state S2 during the time period between the times t3 and t4. The state S2 of the RF signal 216 has the parameter level P15. Also, the RF signal 216 has an occurrence of the state S3 during the time period between the times t4 and t5. The state S3 of the RF signal 216 has the parameter level P17. The RF signal 216 has additional occurrences of the states S1 through S3. The states S1 through S3 of the RF signal 216 repeat during the time period between the times t5 and t10 and again repeat after the time t10.

The state S1 of the RF signal 216 is sometimes referred to herein as an off state, the state S2 of the RF signal 216 is sometimes referred to herein as a low state, and the state S3 of the RF signal 216 is sometimes referred to herein as a high state. A parameter level P11 is greater than the parameter level P10. A parameter level P12 is greater than the parameter level P11 and a parameter level P13 is greater than the parameter level P12. A parameter level P14 is greater than the parameter level P13, the parameter level P15 is greater than the parameter level P14, a parameter level P16 is greater than the parameter level P15, and the parameter level P17 is greater than the parameter level P16. Also, the parameter level P15 is greater than the parameter level P4 of the graph 206 of FIG. 2B.

The RF signal 216 pulses from the state S1 to the state S2 and from the state S2 to the state S3. For example, the RF signal 216 transitions from the state S1 to the state S2 at the time t3 or substantially at the time t3 and transitions from the state S2 to the state S3 at the time t4 or substantially at the time t4. The RF signal 216 further pulses from the state S3 to the state S1. As an example, the RF signal 216 transitions from the state S3 to another occurrence of the state S1 at the time t5 or substantially at the time t5.

In one embodiment, the memory device 126 stores the parameter levels, described herein, for the RF generator RFGB. The processor 124 provides the parameter levels to the RF generator RFGB. For example, the processor 124 sends the parameter levels of the RF signal 216 and an instruction via the transfer cable 132B to the digital signal processor DSPB. The parameter levels of the RF signal 216 are stored in the memory device 126. The DSPB determines from the instruction to distribute the parameter levels of the RF signal 216 to the parameter controllers PRBS(n–N), PRBS(n–2), and PRBS(n–1). For example, the parameter level P10 is sent from the digital signal processor DSPB to the parameter controller PRBS(n–N), the parameter level P15 is sent from the digital signal processor DSPB to the parameter controller PRBS(n–2), and the parameter level P17 is sent from the digital signal processor DSPB to the parameter controller PRBS(n–1). The parameter level P10 is stored in the memory device of the parameter controller PRBS(n–N), the parameter level P15 is stored in the memory device of the parameter controller PRBS(n–2), and the parameter level P17 is stored in the memory device of the parameter controller PRBS(n–1).

FIG. 2E is an embodiment of a graph 218 to illustrate a logic level of a digital pulse signal 220 versus the time t. The digital pulse signal 220 is an example of the digital pulse signal 136C (FIG. 1) that is provided by the processor 124 (FIG. 1) to the RF generator RFGC (FIG. 1). During the time period between the times t0 and t3, the digital pulse signal 220 has an occurrence of the state S1. The state S1 of the digital pulse signal 220 has the logic level 0. Moreover, during a time period between the time t3 and the time t5, the digital pulse signal 220 has an occurrence of the state S2, which has the logic level 1. The occurrences of the states S1 and S2 of the digital pulse signal 220 repeat after the time t5 for the time period between the time t5 and a time t10, and repeat again for the time period after the time t10.

In one embodiment, the digital pulse signal 220 has a duty cycle that is less than or equal to 20%. For example, the digital pulse signal 220 has a duty cycle that is 20% or substantially 20%, such as a duty cycle within 5-10% from the 20% duty cycle. To illustrate, a time period between the times t3 and t5 during which the digital pulse signal 220 has the logic level of greater than zero is less than or equal to 20% of a time period between the times t0 and t5. As another illustration, the digital pulse signal 220 has a duty cycle that can range from 10% to 30%.

FIG. 2F is a diagram of an embodiment of a graph 222 to illustrate an RF signal 224 that is generated by the RF power supply PSC of the RF generator RFGC (FIG. 1). The graph 222 plots a parameter level, such as an amplitude, of the RF signal 224 versus the time t. The RF signal 224 is an example of the RF signal 106 (FIG. 1) that is generated by the RF generator RFGC. The RF signal 224 has an occurrence of the state S1 during the time period between the times t0 and t3. The state S1 of the RF signal 224 has the parameter level P22. Moreover, the RF signal 224 has an occurrence of the state S2 during the time period between the times t3 and t5. The state S2 of the RF signal 224 has a parameter level P25. The RF signal 224 has additional occurrences of the states S1 and S2. The states S1 and S2 of the RF signal 224 repeat during the time period between the times t5 and t10 and again repeat after the time t10.

The state S1 of the RF signal 224 is sometimes referred to herein as a low TCP state and the state S2 of the RF signal 224 is sometimes referred to herein as a high TCP state. As an example, a duty cycle of the low TCP state is greater than or equal to 80% and a duty cycle of the high TCP state is less than equal to 20%. A parameter level P21 is greater than a parameter level P20, which is zero or substantially zero. The parameter level P22 is greater than the parameter level P21 and a parameter level P23 is greater than the parameter level P22. A parameter level P24 is greater than the parameter level P23 and the parameter level P25 is greater than the parameter level P24.

The RF signal 224 pulses from the state S1 to the state S2 and from the state S2 to the state S1. For example, the RF signal 224 transitions from the state S1 to the state S2 at the time t3 or substantially at the time t3 and transitions from the state S2 to the state S1 at the time t5 or substantially at the time t5.

As shown from FIGS. 2B, 2D, and 2F, during the low TCP state, the RF signal 208 is supplied by the RF generator RFGA to the impedance match 104 and during the high TCP state, the RF signal 216 is supplied by the RF generator RFGB to the impedance match 104. During the high TCP state, the RF signal 208 is not supplied by the RF generator RFGA and during the low TCP state, the RF signal 216 is not supplied by the RF generator RFGB.

In one embodiment, the parameter level P20 is the same as the parameter level P0 (FIG. 2B), the parameter level P21 is the same as the parameter level P1 (FIG. 2B), the parameter level P22 is the same as the parameter level P2 (FIG. 2B), the parameter level P23 is the same as the parameter level P3 (FIG. 2B), the parameter level P24 is the same as the parameter level P4 (FIG. 2B), and the parameter level P25 is the same as a parameter level P5 (FIG. 2B).

In an embodiment, the parameter level P20 is the same as the parameter level P10 (FIG. 2D), the parameter level P21 is the same as the parameter level P11 (FIG. 2D), the parameter level P22 is the same as the parameter level P12 (FIG. 2D), the parameter level P23 is the same as the parameter level P13 (FIG. 2D), the parameter level P24 is the same as the parameter level P14 (FIG. 2D), and the parameter level P25 is the same as the parameter level P15 (FIG. 2D).

In one embodiment, the parameter level P22 is greater than the parameter level P15 or P17.

In an embodiment, the parameter level P22 is greater than the parameter level P4.

In one embodiment, the memory device 126 stores the parameter levels, described herein, for the RF generator RFGC. The processor 124 provides the parameter levels to the RF generator RFGC. For example, the processor 124 sends the parameter levels of the RF signal 224 and an instruction via the transfer cable 132C to the digital signal processor DSPC. The parameter levels of the RF signal 224 are stored in the memory device 126. The DSPC determines from the instruction to distribute the parameter levels of the RF signal 224 to the parameter controllers PRCS(n–N) and PRCS(n–2). For example, the parameter level P22 is sent from the digital signal processor DSPC to the parameter controller PRCS(n–N) and the parameter level P25 is sent from the digital signal processor DSPC to the parameter controller PRCS(n–2). The parameter level P22 is stored in the memory device of the parameter controller PRCS(n–N) and the parameter level P25 is stored in the memory device of the parameter controller PRCS(n–2).

FIG. 2G is an embodiment of a graph 226 to illustrate a clock signal 228 versus the time t. The clock signal 228 is an example of the clock signal described above. The clock signal 228 has the logic level 0 for a time period between the time t0 and a time t2.5 and has the logic level 1 for a time period between the time t2.5 and the time t5. The time t2.5 is in the middle of a time period between the times t2 and t3. The clock signal 228 transitions from the logic level 0 to the logic level 1 at the time t2.5 and transitions from the logic level 1 to the logic level 0 at the time t5.

The clock signal 228 has multiple clock cycles 1, 2, 3, and so on. During the clock cycle 1, an occurrence of one or more states of an RF signal or a digital pulse signal, described herein, takes place. During the clock cycle 2, another occurrence of each of the one or more states takes place and during the clock cycle 3, yet another occurrence of each of the one or more states takes place.

It should be noted all digital pulse signals, described herein, and all RF signals, described herein, are synchronized to the clock signal 228. For example, the digital pulse signal 204 (FIG. 2A) transitions from the state S4 to the state S1 at the time t0 at which the clock signal 228 transitions from the logic level 1 to the logic level 0. Also, the digital pulse signal 204 transitions from the state S4 to the state S1 at the time t5 at which the clock signal 228 transitions from the logic level 1 to the logic level 0. As another example, the RF signal 208 (FIG. 2B) transitions from the state S4 to the state S1 at the time t0 or substantially at the time t0. Moreover, the RF signal 208 transitions from the state S4 to the state S1 at the time t5 or substantially at the time t5. As yet another example, the digital pulse signal 212 (FIG. 2C) transitions from the state S3 to the state S1 at the time to and transitions from the state S3 to the state S1 at the time t5. Also, as another example, the RF signal 216 (FIG. 2D) transitions from the state S3 to the state S1 at the time t0 or substantially at the time to. Also, the RF signal 216 transitions from the state S3 to the state S1 at the time t5 or substantially at the time t5. As another example, the digital pulse signal 220 (FIG. 2E) transitions from the state S2 to the state S1 at the time t0 and at the time t5. As yet another example, the RF signal 224 transitions from the state S2 to the state S1 at the time t0 or substantially at the time t0. The RF signal 224 transitions from the state S2 to the state S1 at the time t5 or substantially at the time t5.

Figure 3A:
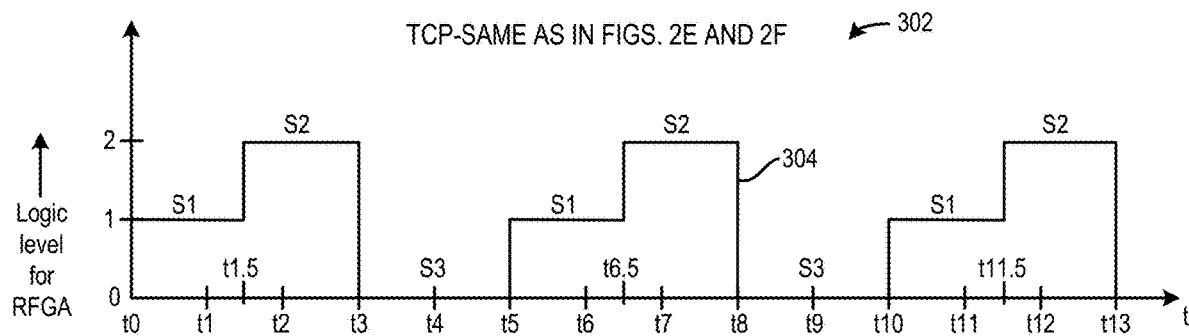
FIG. 3A is an embodiment of a graph to illustrate a logic level of a digital pulse signal versus the time t.
Figure 3B:
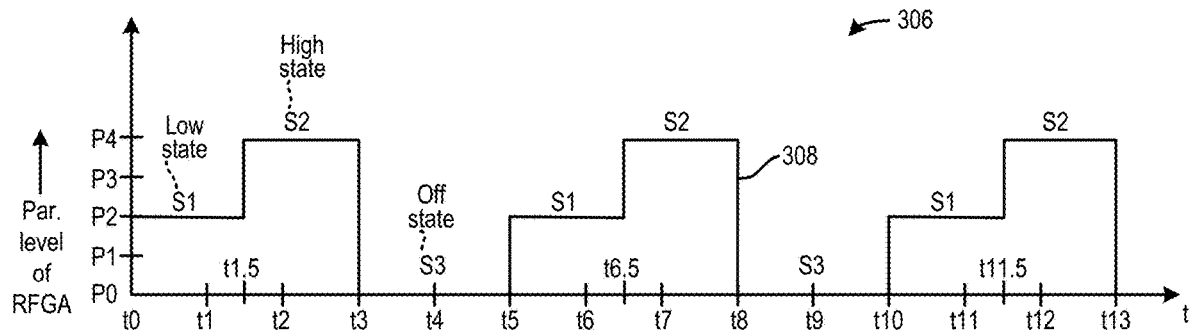
FIG. 3B is a diagram of an embodiment of a graph to illustrate an RF signal that is generated by the RF power supply PSA.

FIG. 3A is an embodiment of a graph 302 to illustrate a logic level of a digital pulse signal 304 versus the time t. The digital pulse signal 304 is an example of the digital pulse signal 136A (FIG. 1) that is provided by the processor 124 (FIG. 1) to the RF generator RFGA (FIG. 1). During a time period between a time t0 and a time t1.5, the digital pulse signal 304 has an occurrence of a state S1. The time t1.5 occurs in the middle of a time period between the time t0 and the time t2. For example, the time t1.5 splits the time period from the time t0 to the time t2 into two halves. The state S1 of the digital pulse signal 304 has the logic level 1. Moreover, during a time period between the time t1.5 and the time t3, the digital pulse signal 304 has an occurrence of a state S2, which has the logic level 2. Also, during a time period between the time t3 and the time t5, the digital pulse signal 304 has an occurrence of a state S3, which has the logic level 0. The occurrences of the states S1 through S3 of the digital pulse signal 304 repeat after the time t5 for a time period between the time t5 and a time t10, and repeat again for a time period after the time t10.

In one embodiment, the digital pulse signal 304 has a duty cycle that is greater than or equal to 80%. For example, the digital pulse signal 304 has a duty cycle that is 80% or substantially 80%, such as a duty cycle within 5-10% from the 80% duty cycle. To illustrate, a time period between the times t0 and t3 during which the digital pulse signal 304 has the logic level of greater than zero is greater than or equal to 80% of a time period between the times t0 and t5. As another illustration, the digital pulse signal 304 has a duty cycle that can range from 70% to 90%.

FIG. 3B is a diagram of an embodiment of a graph 306 to illustrate an RF signal 308 that is generated by the RF power supply PSA of the RF generator RFGA (FIG. 1). The RF signal 308 has the same duty cycle as that of the digital pulse signal 304 (FIG. 3A). The graph 306 plots a parameter level, such as an amplitude, of the RF signal 308 versus the time t. The RF signal 308 is an example of the RF signal 102A (FIG. 1) that is generated by the RF generator RFGA. The RF signal 308 has an occurrence of the state S1 during the time period between the times t0 and t1.5. The state S1 of the RF signal 308 has the parameter level P2. Moreover, the RF signal 308 has an occurrence of the state S2 during the time period between the times t1.5 and t3. The state S2 of the RF signal 308 has the parameter level P4. Also, the RF signal 308 has an occurrence of the state S3 during the time period between the times t3 and t5. The state S3 of the RF signal 308 has the parameter level P0. Occurrences of the states S1 through S3 of the RF signal 308 repeat during the time period between the times t5 and t10 and again repeat after the time t10.

The state S1 of the RF signal 308 is sometimes referred to herein as a low state, the state S2 of the RF signal 308 is sometimes referred to herein as a high state, and the state S3 of the RF signal 308 is sometimes referred to herein as an off state.

The RF signal 308 pulses from the state S1 to the state S2 and from the state S2 to the state S3. For example, the RF signal 308 transitions from the state S1 to the state S2 at the time t1.5 or substantially at the time t1.5 and transitions from the state S2 to the state S3 at the time t3 or substantially at the time t3. The RF signal 308 transitions from the state S3 to another occurrence of the state S1 at the time t5 or substantially at the time t5.

In one embodiment, the state S1 of the RF signal 308 has the parameter level P1 and the state S2 of the RF signal 308 has the parameter level P2 or P3 or P4.

In one embodiment, the memory device 126 stores the parameter levels, described herein, for the RF generator RFGA. The processor 124 provides the parameter levels to the RF generator RFGA. For example, the processor 124 sends the parameter levels of the RF signal 308 and an instruction via the transfer cable 132A to the digital signal processor DSPA. The parameter levels of the RF signal 308 are stored in the memory device 126. The DSPA determines from the instruction to distribute the parameter levels of the RF signal 308 to the parameter controllers PRAS(n–N), PRAS(n–2), and PRAS(n–1). For example, the parameter level P2 is sent from the digital signal processor DSPA to the parameter controller PRAS(n–N), the parameter level P4 is sent from the digital signal processor DSPA to the parameter controller PRAS(n–2), and the parameter level P0 is sent from the digital signal processor DSPA to the parameter controller PRAS(n–1). The parameter level P2 is stored in the memory device of the parameter controller PRAS(n–N), the parameter level P4 is stored in the memory device of the parameter controller PRAS(n–2), and the parameter level P0 is stored in the memory device of the parameter controller PRAS(n–1).

Figure 3C:
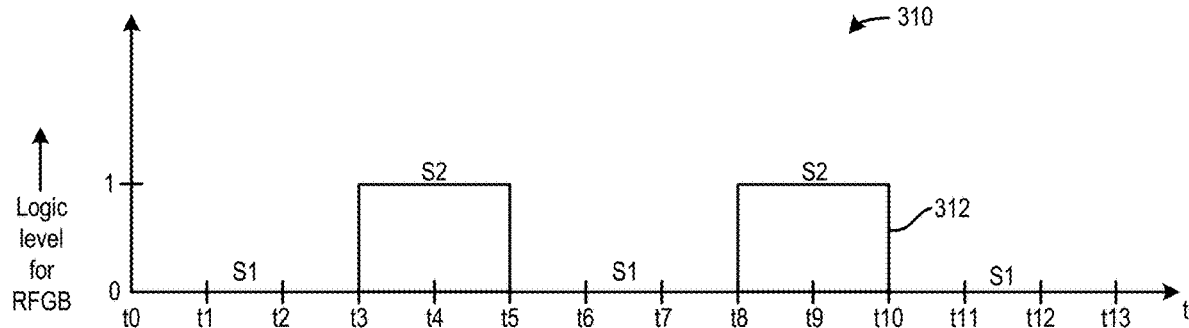
FIG. 3C is an embodiment of a graph to illustrate a logic level of a digital pulse signal versus the time t.
Figure 3D:
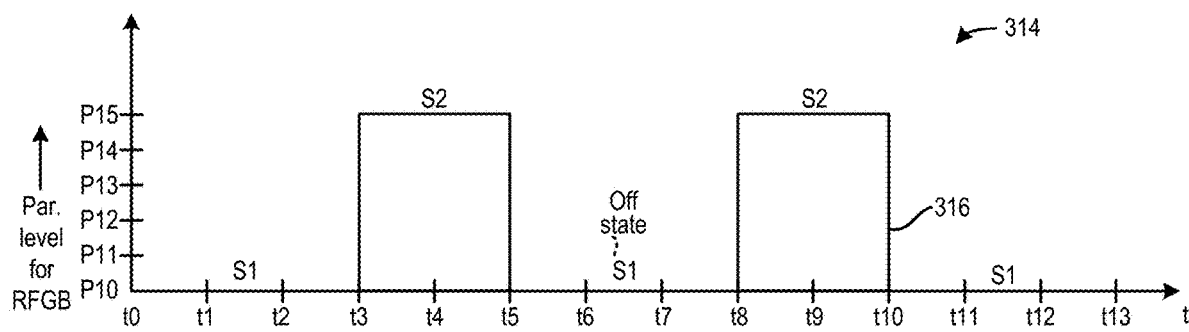
FIG. 3D is a diagram of an embodiment of a graph to illustrate an RF signal that is generated by the RF power supply PSB.

FIG. 3C is an embodiment of a graph 310 to illustrate a logic level of a digital pulse signal 312 versus the time t. The digital pulse signal 312 is an example of the digital pulse signal 136B (FIG. 1) that is provided by the processor 124 (FIG. 1) to the RF generator RFGB (FIG. 1). During the time period between the times to and t3, the digital pulse signal 312 has an occurrence of a state S1. The state S1 of the digital pulse signal 312 has the logic level 0. Moreover, during a time period between the time t3 and the time t5, the digital pulse signal 312 has an occurrence of a state S2, which has the logic level 1. The occurrences of the states S1 and S2 of the digital pulse signal 312 repeat after the time t5 for the time period between the time t5 and a time t10, and repeat again for the time period after the time t10.

In one embodiment, the digital pulse signal 312 has a duty cycle that is less than or equal to 20%. For example, the digital pulse signal 312 has a duty cycle that is 20% or substantially 20%, such as a duty cycle within 5-10% from the 20% duty cycle. To illustrate, a time period between the times t3 and t5 during which the digital pulse signal 312 has the logic level of greater than zero is less than or equal to 20% of a time period between the times t0 and t5. As another illustration, the digital pulse signal 312 has a duty cycle that can range from 10% to 30%.

FIG. 3D is a diagram of an embodiment of a graph 314 to illustrate an RF signal 316 that is generated by the RF power supply PSB of the RF generator RFGB (FIG. 1). A duty cycle of the RF signal 316 is the same as the duty cycle of the digital pulse signal 312. The graph 314 plots a parameter level, such as an amplitude, of the RF signal 316 versus the time t. The RF signal 316 is an example of the RF signal 102B (FIG. 1) that is generated by the RF generator RFGB. The RF signal 316 has an occurrence of the state S1 during the time period between the times t0 and t3. The state S1 of the RF signal 216 has the parameter level P10. Moreover, the RF signal 316 has an occurrence of the state S2 during the time period between the times t3 and t5. The state S2 of the RF signal 316 has the parameter level P15. The RF signal 316 has additional occurrences of the states S1 and S2. The states S1 and S2 of the RF signal 316 repeat during the time period between the times t5 and t10 and again repeat after the time t10.

The state S1 of the RF signal 316 is sometimes referred to herein as an off state, the state S2 of the RF signal 316 is sometimes referred to herein as an on state.

The RF signal 316 pulses from the state S1 to the state S2 and from the state S2 to the state S1. For example, the RF signal 316 transitions from the state S1 to the state S2 at the time t3 or substantially at the time t3 and transitions from the state S2 to the state S1 at the time t5 or substantially at the time t5.

It should be noted that the RF signal 224 is supplied by the RF generator RFGC to the impedance match 108 (FIG. 1) simultaneous with the supply of the RF signal 308 from the RF generator RFGA to the impedance match 104 (FIG. 1) and the supply of the RF signal 316 from the RF generator RFGB to the impedance match 104. For example, the RF signal 308 is supplied by the RF generator RFGA to the impedance match 104 and the RF signal 316 is supplied by the RF generator RFGB to the impedance match 104 during the one or more clock cycles of the clock signal 228 (FIG. 2G). Also, the RF signal 224 is supplied by the RF generator RFGC to the impedance match 108 during the same one or more clock cycles of the clock signal 228.

As shown from FIGS. 3B, 3D, and 2F, during the low TCP state, the RF signal 308 is supplied by the RF generator RFGA to the impedance match 104 and during the high TCP state, the RF signal 316 is supplied by the RF generator RFGB to the impedance match 104. During the high TCP state, the RF signal 308 is not supplied by the RF generator RFGA and during the low TCP state, the RF signal 316 is not supplied by the RF generator RFGB.

In one embodiment, the memory device 126 stores the parameter levels, described herein, for the RF generator RFGB. The processor 124 provides the parameter levels to the RF generator RFGB. For example, the processor 124 sends the parameter levels of the RF signal 316 and an instruction via the transfer cable 132B to the digital signal processor DSPB. The parameter levels of the RF signal 316 are stored in the memory device 126. The DSPB determines from the instruction to distribute the parameter levels of the RF signal 316 to the parameter controllers PRBS(n–N) and PRBS(n–2). For example, the parameter level P10 is sent from the digital signal processor DSPB to the parameter controller PRBS(n–N) and the parameter level P15 is sent from the digital signal processor DSPB to the parameter controller PRBS(n–2). The parameter level P10 is stored in the memory device of the parameter controller PRBS(n–N) and the parameter level P15 is stored in the memory device of the parameter controller PRBS(n–2).

Figure 4A:
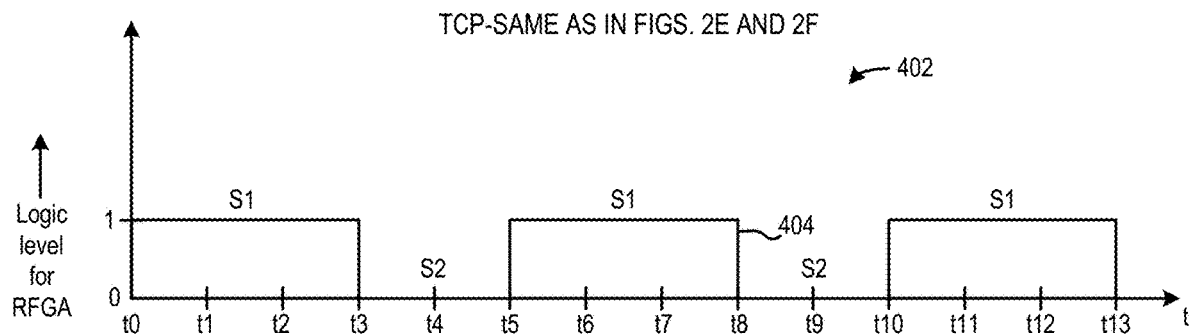
FIG. 4A is an embodiment of a graph to illustrate a logic level of a digital pulse signal versus the time t.
Figure 4B:
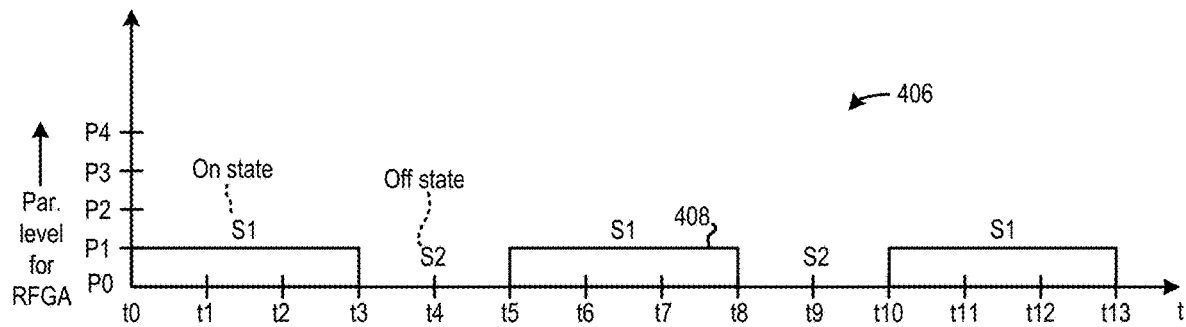
FIG. 4B is a diagram of an embodiment of a graph to illustrate an RF signal that is generated by the RF power supply PSA.

FIG. 4A is an embodiment of a graph 402 to illustrate a logic level of a digital pulse signal 404 versus the time t. The digital pulse signal 404 is an example of the digital pulse signal 136A (FIG. 1) that is provided by the processor 124 (FIG. 1) to the RF generator RFGA (FIG. 1). During a time period between a time t0 and the time t3, the digital pulse signal 404 has an occurrence of the state S1. The state S1 of the digital pulse signal 404 has the logic level 1. Moreover, during a time period between the time t3 and the time t5, the digital pulse signal 404 has an occurrence of the state S2, which has the logic level 0. The occurrences of the states S1 and S2 of the digital pulse signal 404 repeat after the time t5 for a time period between the time t5 and a time t10, and repeat again for a time period after the time t10.

In one embodiment, the digital pulse signal 404 has a duty cycle that is greater than or equal to 80%. For example, the digital pulse signal 404 has a duty cycle that is 80% or substantially 80%, such as a duty cycle within 5-10% from the 80% duty cycle. To illustrate, a time period between the times t0 and t3 during which the digital pulse signal 404 has the logic level of greater than zero is greater than or equal to 80% of a time period between the times t0 and t5. As another illustration, the digital pulse signal 404 has a duty cycle that ranges from 70% to 90%.

FIG. 4B is a diagram of an embodiment of a graph 406 to illustrate an RF signal 408 that is generated by the RF power supply PSA of the RF generator RFGA (FIG. 1). The RF signal 408 has the same duty cycle as that of the digital pulse signal 404 (FIG. 4A). The graph 406 plots a parameter level, such as an amplitude, of the RF signal 408 versus the time t. The RF signal 408 is an example of the RF signal 102A (FIG. 1) that is generated by the RF generator RFGA. The RF signal 408 has an occurrence of a state S1 during the time period between the times t0 and t3. The state S1 of the RF signal 408 has the parameter level P1. Moreover, the RF signal 408 has an occurrence of a state S2 during the time period between the times t3 and t5. The state S2 of the RF signal 408 has the parameter level P0. Occurrences of the states S1 and S2 of the RF signal 408 repeat during the time period between the times t5 and t10 and again repeat after the time t10.

The state S1 of the RF signal 408 is sometimes referred to herein as an on state and the state S2 of the RF signal 408 is sometimes referred to herein as an off state.

The RF signal 406 pulses from the state S1 to the state S2 and from the state S2 to the state S1. For example, the RF signal 408 transitions from the state S1 to the state S2 at the time t3 or substantially at the time t3 and transitions from the state S2 to the state S1 at the time t5 or substantially at the time t5.

In one embodiment, the state S1 of the RF signal 308 has the parameter level P2 or P3 or P4.

In one embodiment, the memory device 126 stores the parameter levels, described herein, for the RF generator RFGA. The processor 124 provides the parameter levels to the RF generator RFGA. For example, the processor 124 sends the parameter levels of the RF signal 408 and an instruction via the transfer cable 132A to the digital signal processor DSPA. The parameter levels of the RF signal 408 are stored in the memory device 126. The DSPA determines from the instruction to distribute the parameter levels of the RF signal 408 to the parameter controllers PRAS(n–N) and PRAS(n–2). For example, the parameter level P1 is sent from the digital signal processor DSPA to the parameter controller PRAS(n–N) and the parameter level P0 is sent from the digital signal processor DSPA to the parameter controller PRAS(n–2). The parameter level P1 is stored in the memory device of the parameter controller PRAS(n–N) and the parameter level P0 is stored in the memory device of the parameter controller PRAS(n–2).

Figure 4C:
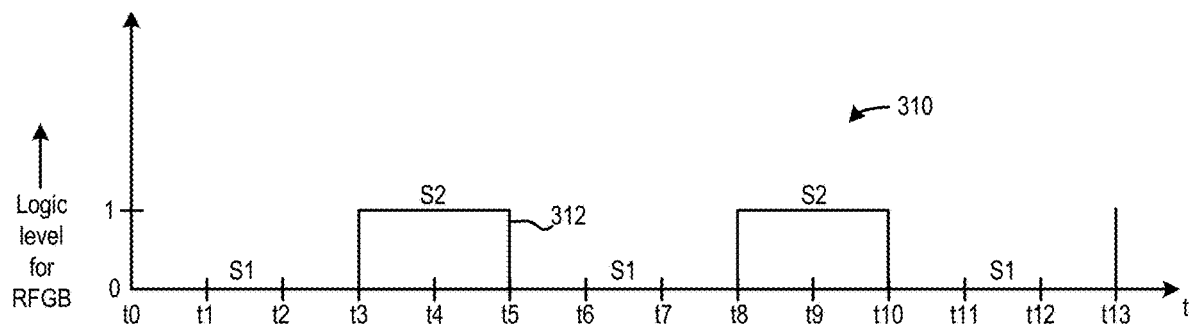
FIG. 4C is an embodiment of the graph of FIG. 3C.
Figure 4D:
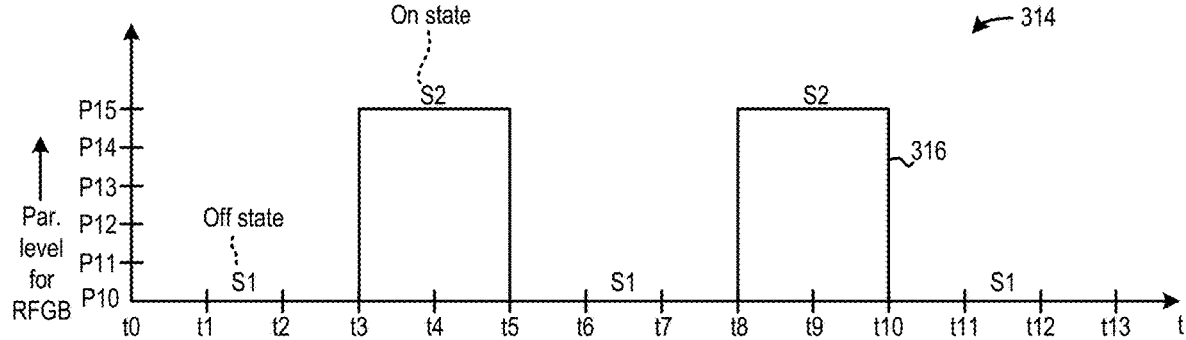
FIG. 4D is an embodiment of the graph of FIG. 3D.

FIG. 4C is an embodiment of the graph 310 to illustrate that the digital pulse signal 312 is supplied from the processor 124 (FIG. 1) to the RF generator RFGB simultaneous with supplying the digital pulse signal 404 to the RF generator RFGA.

FIG. 4D is a diagram of an embodiment of the graph 314 to illustrate that the RF signal 316 is supplied by the RF generator RFGB to the impedance match 104 in synchronization with the digital pulse signal 312.

It should be noted that the RF signal 224 is supplied by the RF generator RFGC to the impedance match 108 (FIG. 1) simultaneous with the supply of the RF signal 408 from the RF generator RFGA to the impedance match 104 (FIG. 1)

and the supply of the RF signal 316 from the RF generator RFGB to the impedance match 104. For example, the RF signal 408 is supplied by the RF generator RFGA to the impedance match 104 and the RF signal 316 is supplied by the RF generator RFGB to the impedance match 104 during the one or more clock cycles of the clock signal 228 (FIG. 2G). Also, the RF signal 224 is supplied by the RF generator RFGC to the impedance match 108 during the same one or more clock cycles of the clock signal 228.

As shown from FIGS. 4B, 4D, and 2F, during the low TCP state, the RF signal 408 is supplied by the RF generator RFGA to the impedance match 104 and during the high TCP state, the RF signal 316 is supplied by the RF generator RFGB to the impedance match 104. During the high TCP state, the RF signal 408 is not supplied by the RF generator RFGA and during the low TCP state, the RF signal 316 is not supplied by the RF generator RFGB.

In one embodiment, the states of the RF signal 102A (FIG. 1) between the times t0 and t3 are sometimes referred to herein as a low bias state and the states of the RF signal 102B (FIG. 1) between the times t3 and t5 are sometimes referred to herein as a high bias state.

In an embodiment, an amplitude at a parameter level for a state is outside a pre-determined range from an amplitude at a different parameter level for another state. For example, a peak-to-peak magnitude of the parameter level P2 is greater than a peak-to-peak magnitude of the parameter level P1 by at least 15%.

In one embodiment, functions described herein as performed by a controller, such as a parameter controller or a frequency controller, are performed by a processor of the controller.

Figure 5:
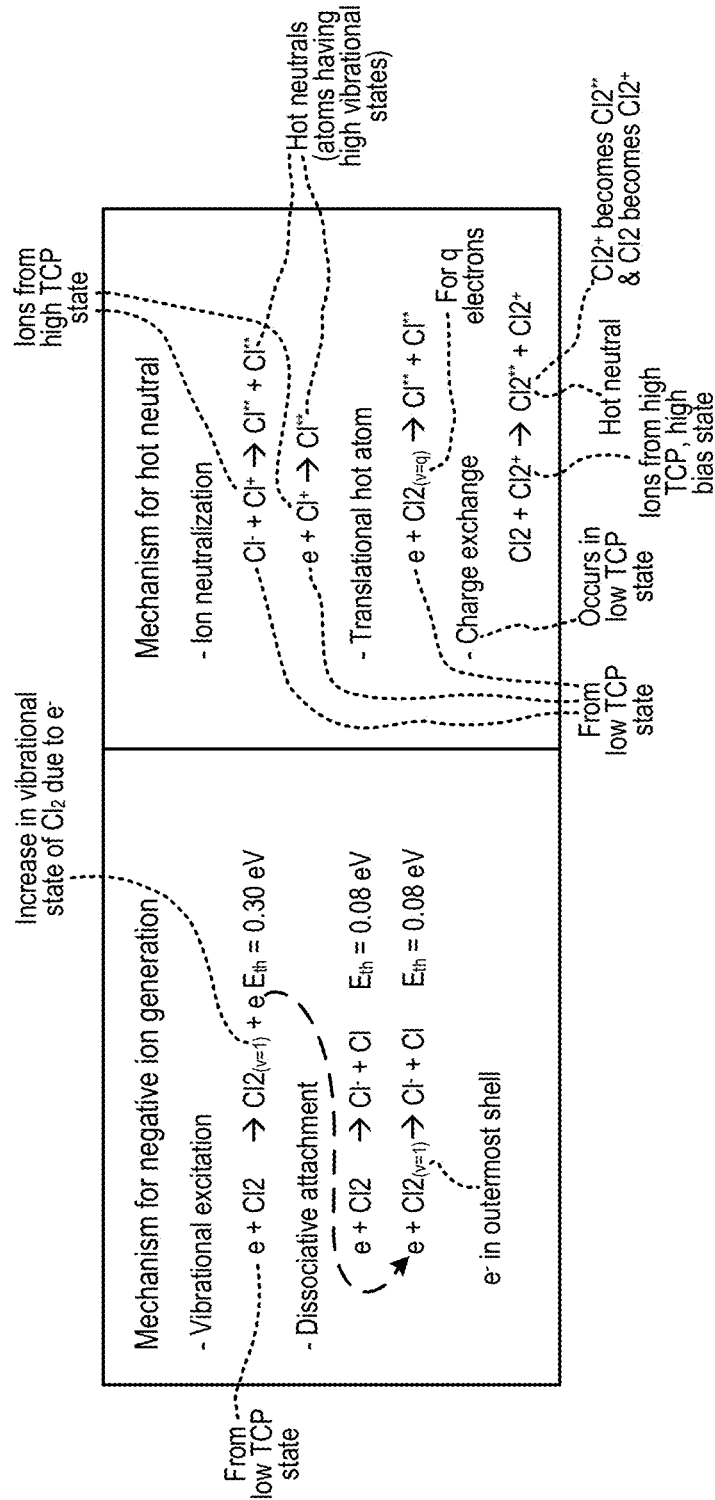
FIG. 5 is a diagram to illustrate chemical reactions among a process gas, electrons that are generated during a low TCP state and a low bias state, and ions that are generated during a high TCP state and a high bias state.

FIG. 5 is a diagram to illustrate chemical reactions between a process gas, such as chorine ($Cl_2$), electrons and ions, which are mostly generated during the high TCP state and the high bias state. A molecule of the process gas $Cl_2$ is labeled as Cl2 in FIG. 5. The process gas is supplied to a gap between the upper electrode 130 (FIG. 1) and the substrate support 128 (FIG. 1).

In a vibrational excitation reaction during the low TCP and low bias state, the process gas $Cl_2$ interacts with an electron and the resulting excited Cl2 molecule can have further successive electron interactions. The electrons are mostly generated during the high TCP state and the high bias state but continue to be generated during the low TCP and low bias state. The processor gas $Cl_2$ interacts with the electrons and is vibrationally excited. For example, the molecule Cl2 interacts with an electron e to create a vibrational state v of the molecule Cl2. The increase in the vibrational state of the molecule Cl2 is shown as $Cl2_{(v=1)}$ in FIG. 5. For each electron that vibrationally excites the molecule Cl2, an amount of energy of the molecule Cl2 increases by 0.3 electron volts (eV) and the vibration state of the molecule Cl2 increases from zero to 1, which is represented as v=1.

In a dissociative attachment reaction that occurs during the low TCP and low bias state, the process gas Cl2 interacts with the electrons to disassociate into negative ions and atoms. For example, the molecule Cl2 interacts with one electron to disassociate into a negative chlorine ion, represented by $Cl^-$, and a chlorine atom, represented by Cl. An amount of energy of the negative chlorine ion increases by 0.08 eV. Moreover, in the dissociative attachment reaction, the process gas Cl2 with the increased vibration state interacts with one or more other electrons to disassociate into negative ions and atoms. As an example, the molecule Cl2 having the vibrational state v=1 interacts with one electron to disassociate into a negative chlorine ion, represented by $Cl^-$, and a chlorine atom, represented by Cl. An amount of energy of the negative chlorine ion increases by 0.08 eV.

In an ion neutralization reaction that occurs during the low TCP and low bias state, the negative chlorine ions generated in the low TCP state and the low bias state interact with positive chlorine ions generated during the high TCP state and the high bias state to generate hot neutral atoms. For example, the negative chlorine ion interacts with the positive chlorine ion, represented as $Cl^+$, to generate two hot neutral atoms. Each hot neutral atom is represented as $Cl^{**}$. Moreover in the ion neutralization reaction, the electrons from the low TCP state and the low bias state interacts with the positive chlorine ions from the high TCP state and the high bias state to generate hot neutral atoms. For example, the electron e interacts with the positive chlorine ion to generate a hot neutral atom.

Also, in a translational hot atom reaction that occurs during the low TCP reaction and the low bias state, the electrons from the low TCP state and the low bias state interact with the chlorine molecules that are vibrationally excited to generate hot neutral atoms. As an example, the electron e interacts with a vibrationally exited chlorine molecule CL2 having a vibrational state v=q to generate hot neutral atoms, where q is a total number of successive electron impacts.

In a charge exchange reaction that occurs during the low TCP state and the low bias state, the process gas chlorine interacts with chlorine molecular ions to generate hot neutral molecules. For example, a chlorine molecule of the process gas interacts with a chlorine molecular ion that is generated by the high TCP and high bias state. The interaction generates a hot neutral molecule, represented as $Cl2^{}$. The chlorine molecule Cl2 changes into the hot neutral molecule, represented as $Cl2^{}$. It should be noted that a hot neutral molecule or a hot neutral atom or a combination thereof is sometimes referred to herein as a hot neutral. The hot neutral is sometimes referred to herein as a high energy neutral.

FIG. 6A is an embodiment of an embodiment of a graph 602 to illustrate a plot of energy of hot neutrals versus an angle θ, measured in degrees to illustrate an angular spread of the hot neutrals across a surface of the substrate S. The graph 602 is plotted when a continuous bias voltage is applied to the substrate support 128 (FIG. 1). For example, an RF signal (not shown) that is applied to the substrate support 128 is not pulsed from one state to another. As another example, the RF signal (not shown) that is applied to the substrate support 128 has a single parameter level. As shown in FIG. 6A, a low number of hot neutrals are created by the continuous bias voltage.

FIG. 6B is a diagram of an embodiment of a graph 604 to illustrate a plot of hot energy neutrals versus the angle θ. The plot 604 is generated when the low TCP state and the low bias state are applied. There is a large amount of hot neutrals generated as a result of the vibrational excitation and the ion neutralization reactions during the low TCP state and the low bias state. The large amount of hot neutrals are isotropic.

FIG. 6C is a diagram of an embodiment of a graph 606 to illustrate a plot of hot neutrals versus the angle θ. The plot 606 is generated when the low TCP state and the low bias state are applied. A directionality of the hot neutrals increases as a result of the charge exchange reactions during the low TCP state and the low bias state. The increase in the directionality decreases an angular spread of the hot neutrals across a surface of the substrate S. The directionality of the hot neutrals increases as a result of pulsing of the RF signal 102A during the low TCP state. For example, the directionality increases due to pulsing of the RF signal 208 (FIG. 2B) from the state S1 to the state S2 and further to the state S3. As another example, the directionality increases due to pulsing of the RF signal 308 (FIG. 3B) from the state S1 to the state S2. The hot neutrals have a low angular spread with the increased directionality. The directionality facilitates etching dense features of the substrate S (FIG. 1) and increases an etch rate of etching the dense features.

In a similar manner, pulsing of the RF signal 102B (FIG. 1) increases directionality of ions of plasma during the high TCP state. For example, the pulsing of the RF signal 216 (FIG. 2D) from the state S2 to the state S3 increases directionality of ions to reduce an angular spread of the ions across the top surface of the substrate S to facilitate an increase in etch rate of etching the isolation features of the substrate S.

FIG. 7A is a diagram of an embodiment of a substrate 702 to illustrate depths of isolation features and dense features after the high TCP state and the high bias state. The substrate 702 is an example of the substrate S (FIG. 1). The substrate 702 has a silicon layer 704A and a silicon dioxide layer 704B that is overlaid on top of the silicon layer 704A. The substrate 702 has multiple isolation features, such as an isolation feature 706A, and has multiple dense features, such as a dense feature 706B. The isolation feature 706A has a wider opening than an opening of the dense feature 706B.

The isolation features are etched at a higher rate during the high TCP state and the high bias state compared to the dense features. The isolation features and the dense features are etched by ions generated in the high TCP state and the high bias state. Due to the wider openings of the isolation features, the isolation features are etched at the higher rate. Similarly, due to the narrower openings of the dense features, the dense features are etched at a lower rate during the high TCP state and the high bias state. Also, during the high TCP state and the high bias state, there is a higher amount of passivation by radicals within etch depths of the isolation features compared to an amount of passivation of the radicals within etch depths of the dense features. The higher amount of passivation creates passivation layers, such as a passivation layer 708, within the etch depths of the isolation features. During the high TCP state and the high bias state, the radicals are able to enter the wider openings of the isolation features to create the passivation layers and have difficulty in entering the narrower openings of the dense features.

FIG. 7B is a diagram of an embodiment of the substrate 702 after applying the low TCP state and the low bias state, such as after 30 percent of a pre-determined time period T. The hot neutrals generated during the low TCP state and the low bias state etch the dense features during the low TCP state and the low bias state and it is difficult for the hot neutrals to etch the isolation features during the low TCP state and low bias state. It is difficult for the hot neutrals to etch the isolation features due to the passivation layer 708 (FIG. 7A). The hot neutrals do not have enough energy to quickly etch away the passivation layer 708. As a result, the dense features are etched at a faster rate during the low TCP state and the low bias state than the isolation features.

FIG. 7C is a diagram of an embodiment of the substrate 702 after applying the low TCP and low bias state, such as after 50 percent of the pre-determined time period T. As shown in FIG. 7C, an etch depth of the dense feature is the same or substantially the same as an etch depth of the isolation features.

FIG. 7D is a diagram of an embodiment of the substrate 702 after applying the low TCP state and the low bias state, such as after 100 percent of the pre-determined time period T. As shown in FIG. 7D, an etch depth of the dense feature 706B is the same or substantially the same as an etch depth of the isolation feature 706A.

As such, by applying the low TCP state and the low bias state and the high TCP state and the high bias state, the dense features and the isolation features are etched by the same amount or substantially the same amount.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

In some embodiments, a controller is part of a system, which may be part of the above-described examples. Such systems include semiconductor processing equipment, including a processing tool or tools, chamber or chambers, a platform or platforms for processing, and/or specific processing components (a wafer pedestal, a gas flow system, etc.). These systems are integrated with electronics for controlling their operation before, during, and after processing of a semiconductor wafer or substrate. The electronics is referred to as the "controller," which may control various components or subparts of the system or systems. The controller, depending on the processing requirements and/or the type of system, is programmed to control any of the processes disclosed herein, including the delivery of process gases, temperature settings (e.g., heating and/or cooling), pressure settings, vacuum settings, power settings, RF generator settings, RF matching circuit settings, frequency settings, flow rate settings, fluid delivery settings, positional and operation settings, wafer transfers into and out of a tool and other transfer tools and/or load locks coupled to or interfaced with a system.

Broadly speaking, in a variety of embodiments, the controller is defined as electronics having various integrated circuits, logic, memory, and/or software that receive instructions, issue instructions, control operation, enable cleaning operations, enable endpoint measurements, and the like. The integrated circuits include chips in the form of firmware that store program instructions, digital signal processors (DSPs), chips defined as ASICs, PLDs, and/or one or more microprocessors, or microcontrollers that execute program instructions (e.g., software). The program instructions are instructions communicated to the controller in the form of various individual settings (or program files), defining the parameters, the factors, the variables, etc., for carrying out a particular process on or for a semiconductor wafer or to a system. The program instructions are, in some embodiments, a part of a recipe defined by process engineers to accomplish one or more processing steps during the fabrication of one or more layers, materials, metals, oxides, silicon, silicon dioxide, surfaces, circuits, and/or dies of a wafer.

The controller, in some embodiments, is a part of or coupled to a computer that is integrated with, coupled to the system, otherwise networked to the system, or a combination thereof. For example, the controller is in a "cloud" or all or a part of a fab host computer system, which allows for remote access of the wafer processing. The computer enables remote access to the system to monitor current progress of fabrication operations, examines a history of past fabrication operations, examines trends or performance metrics from a plurality of fabrication operations, to change parameters of current processing, to set processing steps to follow a current processing, or to start a new process.

In some embodiments, a remote computer (e.g. a server) provides process recipes to a system over a network, which includes a local network or the Internet. The remote computer includes a user interface that enables entry or programming of parameters and/or settings, which are then communicated to the system from the remote computer. In some examples, the controller receives instructions in the form of data, which specify the parameters, factors, and/or variables for each of the processing steps to be performed during one or more operations. It should be understood that the parameters, factors, and/or variables are specific to the type of process to be performed and the type of tool that the controller is configured to interface with or control. Thus as described above, the controller is distributed, such as by including one or more discrete controllers that are networked together and working towards a common purpose, such as the processes and controls described herein. An example of a distributed controller for such purposes includes one or more integrated circuits on a chamber in communication with one or more integrated circuits located remotely (such as at the platform level or as part of a remote computer) that combine to control a process on the chamber.

Without limitation, in various embodiments, example systems to which the methods, described herein, are applied include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that is associated or used in the fabrication and/or manufacturing of semiconductor wafers.

It is further noted that in some embodiments, the above-described operations apply to several types of plasma chambers, e.g., a plasma chamber including an inductively coupled plasma (ICP) reactor, a transformer coupled plasma chamber, conductor tools, dielectric tools, a plasma chamber including an electron cyclotron resonance (ECR) reactor, etc. For example, one or more RF generators are coupled to an inductor within the ICP reactor. Examples of a shape of the inductor include a solenoid, a dome-shaped coil, a flat-shaped coil, etc.

As noted above, depending on the process step or steps to be performed by the tool, the host computer communicates with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

With the above embodiments in mind, it should be understood that some of the embodiments employ various computer-implemented operations involving data stored in computer systems. These operations are those physically manipulating physical quantities. Any of the operations described herein that form part of the embodiments are useful machine operations.

Some of the embodiments also relate to a hardware unit or an apparatus for performing these operations. The apparatus is specially constructed for a special purpose computer. When defined as a special purpose computer, the computer performs other processing, program execution or routines that are not part of the special purpose, while still being capable of operating for the special purpose.

In some embodiments, the operations may be processed by a computer selectively activated or configured by one or more computer programs stored in a computer memory, cache, or obtained over the computer network. When data is obtained over the computer network, the data may be processed by other computers on the computer network, e.g., a cloud of computing resources.

One or more embodiments can also be fabricated as computer-readable code on a non-transitory computer-readable medium. The non-transitory computer-readable medium is any data storage hardware unit, e.g., a memory device, etc., that stores data, which is thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. In some embodiments, the non-transitory computer-readable medium includes a computer-readable tangible medium distributed over a network-coupled computer system so that the computer-readable code is stored and executed in a distributed fashion.

Although the method operations above were described in a specific order, it should be understood that in various embodiments, other housekeeping operations are performed in between operations, or the method operations are adjusted so that they occur at slightly different times, or are distributed in a system which allows the occurrence of the method operations at various intervals, or are performed in a different order than that described above.

It should further be noted that in an embodiment, one or more features from any embodiment described above are combined with one or more features of any other embodiment without departing from a scope described in various embodiments described in the present disclosure.

Although the foregoing embodiments have been described in some detail for purposes of clarity of understanding, it will be apparent that certain changes and modifications can be practiced within the scope of appended claims. Accordingly, the present embodiments are to be considered as illustrative and not restrictive, and the embodiments are not to be limited to the details given herein.

What is claimed is:

1. A method for etching isolation and dense features within a substrate, comprising:
supplying a first frequency bias radio frequency (RF) signal to a first impedance matching circuit;
supplying a second frequency bias RF signal to the first impedance matching circuit; and
pulsing a third RF signal between a first state and a second state to provide the third RF signal to a second impedance matching circuit, wherein the first frequency bias RF signal is supplied during the first state to etch the dense features and the second frequency bias RF signal is supplied during the second state to etch the isolation features.

2. The method of claim 1, wherein the first frequency bias RF signal is a low frequency bias RF signal, the second frequency bias RF signal is a high frequency bias RF signal and the third RF signal is a transformer coupled plasma (TCP) RF signal.

3. The method of claim 2, wherein the first state is a low TCP state and the second state is a high TCP state.

4. The method of claim 1, wherein the first frequency bias RF signal has a plurality of states and the second frequency bias RF signal has a plurality of states.

5. The method of claim 4, wherein the plurality of states of the first frequency bias RF signal is four, and the plurality of states of the second frequency bias RF signal is three.

6. The method of claim 4, wherein the plurality of states of the first frequency bias RF signal is three, and the plurality of states of the second frequency bias RF signal is two.

7. The method of claim 4, wherein the plurality of states of the first frequency bias RF signal is two, and the plurality of states of the second frequency bias RF signal is two.

8. The method of claim 1, wherein the first state of the third RF signal has a lower parameter level than the second state of the third RF signal.

9. The method of claim 1, wherein the first frequency bias RF signal is not supplied during the second state and the second frequency bias RF signal is not supplied during the first state.

10. The method of claim 1, wherein the first and second states occur during a clock cycle of a clock signal.

11. The method of claim 1, further comprising:
outputting a first modified bias RF signal from the first impedance matching circuit to a plasma chamber upon receiving the first frequency bias RF signal and the second frequency bias RF signal; and
outputting a second modified RF signal from the second impedance matching circuit to the plasma chamber upon receiving the third RF signal.

12. The method of claim 1, wherein the first frequency bias RF signal is pulsed during the first state to decrease an angular spread of high energy neutrals for increasing an etch rate of etching the dense features, and wherein the second frequency bias RF signal is pulsed during the second state to decrease an angular spread of ions for increasing an etch rate of etching the isolation features.

13. The method of claim 1, wherein the first state is a first source state and the second state is a second source state, wherein the first frequency bias RF signal is pulsed during the first source state from a first frequency first bias state to a first frequency second bias state and from the first frequency second bias state to a first frequency third bias state to decrease an angular spread of high energy neutrals for increasing an etch rate of etching the dense features, and wherein the second frequency bias RF signal is pulsed during the second source state from a second frequency first bias state to a second frequency second bias state to decrease an angular spread of ions for increasing an etch rate of etching the isolation features.

14. The method of claim 1, wherein the first frequency bias RF signal transitions from a first frequency first bias state to a first frequency second bias state, and wherein the second frequency bias RF signal transitions from a second frequency first bias state to a second frequency second bias state.

15. The method of claim 1, wherein the first frequency bias RF signal is pulsed during the first state from a first frequency first bias state to a first frequency second bias state to decrease an angular spread of high energy neutrals for increasing an etch rate of etching the dense features, and wherein the second frequency bias RF signal has an on state during the second state.

16. The method of claim 1, wherein the first frequency bias RF signal has an on state during the first state, and wherein the second frequency bias RF signal has an on state during the second state.

17. A system for etching isolation and dense features within a substrate, comprising:
a first frequency radio frequency (RF) generator configured to supply a first frequency bias RF signal to a first impedance matching circuit;
a second frequency RF generator configured to supply a second frequency bias RF signal to the first impedance matching circuit; and
a third RF generator configured to pulse a third RF signal between a first state and a second state to provide the third RF signal to a second impedance matching circuit, wherein the first frequency bias RF signal is supplied during the first state to etch the dense features and the second frequency bias RF signal is supplied during the second state to etch the isolation features.

18. The system of claim 17, wherein the first frequency bias RF signal has a plurality of states and the second frequency bias RF signal has a plurality of states.

19. A controller for etching isolation and dense features within a substrate, comprising:
one or more processors configured to:
control a first frequency radio frequency (RF) generator to supply a first frequency bias RF signal to a first impedance matching circuit;
control a second frequency RF generator to supply a second frequency bias RF signal to the first impedance matching circuit; and
control a third RF generator to pulse a third RF signal between a first state and a second state and to provide the third RF signal to a second impedance matching circuit;
wherein the one or more processors are further configured to:
control the first frequency RF generator to supply the first frequency bias RF signal during the first state to etch the dense features; and
control the second frequency RF generator to supply the second frequency bias RF signal during the second state to etch the isolation features; and
a memory device coupled to the one or more processors.

20. The controller of claim 19, wherein the first frequency bias RF signal has a plurality of states and the second frequency bias RF signal has a plurality of states.

* * * * *